United States Patent [19]

Baker et al.

[11] Patent Number: 5,655,354

[45] Date of Patent: Aug. 12, 1997

[54] METHOD AND APPARATUS FOR AUTOMATED VERIFICATION AND LOADING OF PRECISION DRILL BITS INTO A DRILLING MACHINE PACKAGE

[75] Inventors: James C. Baker, Woodbury; Robert C. Henningsgard, Maple Grove, both of Minn.; Benjamin Mihai, Corona, Calif.; Paul D. Mortell, Eden Prairie, Minn.; Tim L. Taylor, Newport Beach, Calif.

[73] Assignee: Tycom Corporation, Irvine, Calif.

[21] Appl. No.: 411,419

[22] Filed: Mar. 27, 1995

[51] Int. Cl.[6] .................................................. B65B 59/02
[52] U.S. Cl. ........................... 53/474; 53/445; 53/468; 53/504; 33/201; 483/58; 483/63
[58] Field of Search .............................. 33/201, 555.1, 33/555.2, 555.3, 555.4; 53/155, 238, 445, 474, 54, 498, 500, 504, 468, 492, 381.4, 382.1; 294/64.1; 414/225, 226; 209/586, 601, 659; 29/709, 710, 720, 407.01, 407.04, 407.05; 483/9, 36, 37, 54, 55, 58, 63, 64, 66, 901, 902

[56] References Cited

U.S. PATENT DOCUMENTS

| | | | |
|---|---|---|---|
| 4,380,295 | 4/1983 | Soderberg et al. | 33/201 X |
| 4,543,636 | 9/1985 | Noda et al. | 483/58 X |
| 4,567,659 | 2/1986 | Kitamura | 33/201 X |
| 4,601,382 | 7/1986 | Roberts et al. | |
| 4,630,428 | 12/1986 | Lesch | 53/238 X |
| 4,677,808 | 7/1987 | Chenevard | 53/238 |
| 4,715,108 | 12/1987 | Sugiyama et al. | 483/54 |
| 4,722,169 | 2/1988 | De Santis | 53/504 X |
| 4,802,816 | 2/1989 | Mezhinsky | |
| 4,869,813 | 9/1989 | Bailey et al. | 209/538 |
| 5,139,150 | 8/1992 | Fuller, Jr. et al. | 209/586 X |
| 5,205,805 | 4/1993 | Otani et al. | 483/9 |
| 5,212,391 | 5/1993 | Wachli | |
| 5,246,316 | 9/1993 | Smith | |
| 5,249,348 | 10/1993 | Hall | |
| 5,401,229 | 3/1995 | Otsuka et al. | 483/15 |

*Primary Examiner*—Daniel Moon
*Attorney, Agent, or Firm*—Kinney & Lange, P.A.

[57] ABSTRACT

An apparatus and method for automated loading of a drilling machine package having a plurality of drill bit receiving openings arranged in a known configuration with verified precision drill bits from a drill bit container is disclosed. The apparatus includes an automated transfer machine which is connected to a control device, a package frame, a container receiving member, and a diameter sensing device. While not necessarily connected to the automated transfer machine, the package frame and the container receiving member are located at positions which are accessible by the automated transfer machine. Further, the diameter sensing device is operably associated with the automated transfer machine. The method of operation includes the control device recalling data specific to a particular job. A drill bit container is placed on the container receiving member. The automated transfer machine removes a precision drill bit from the drill bit container and the diameter sensing device measures the diameter of the precision drill bit. The automated transfer machine delivers the precision drill bit to the package frame where it is loaded into a drill bit receiving opening in a stored drilling package.

31 Claims, 25 Drawing Sheets

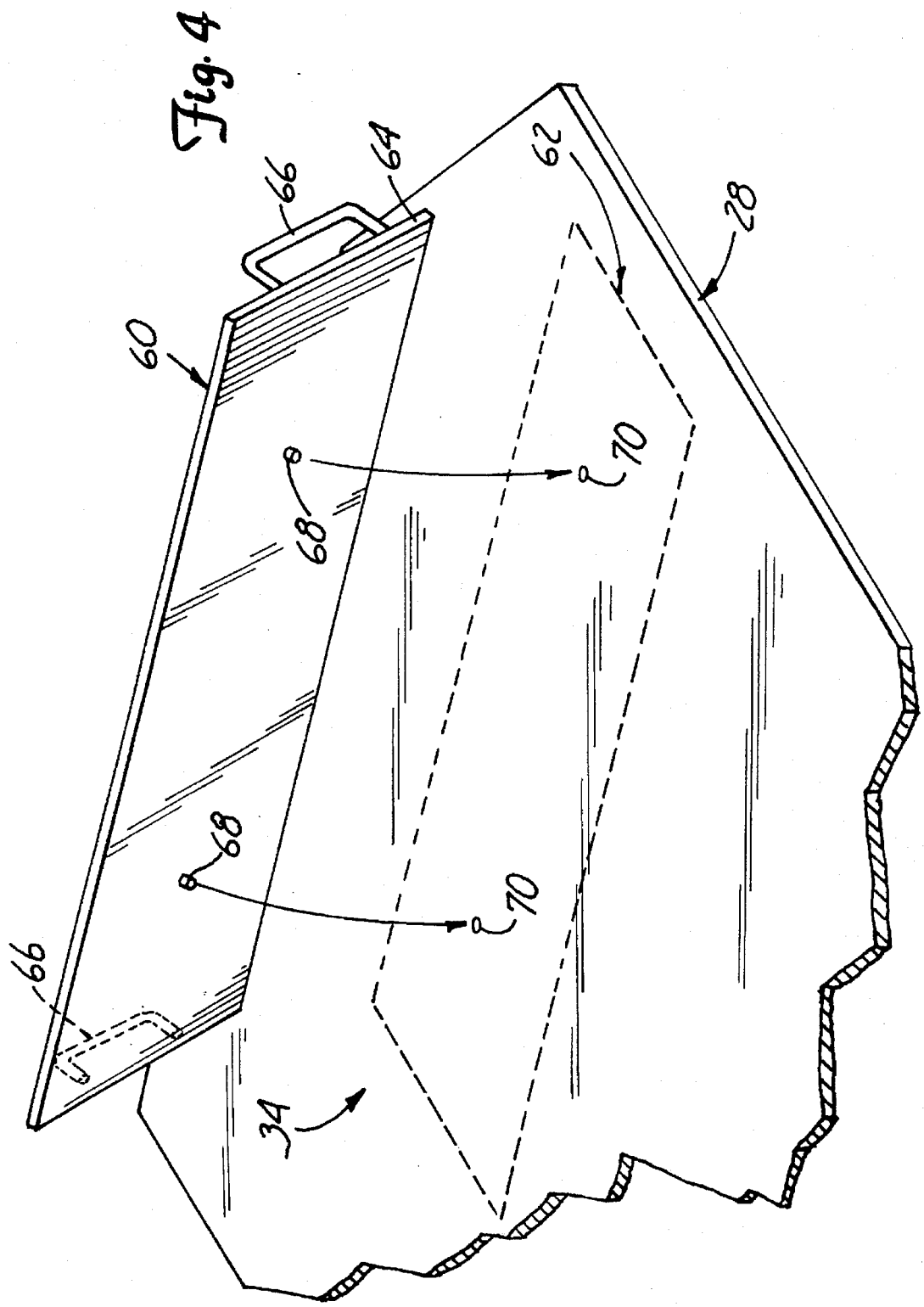

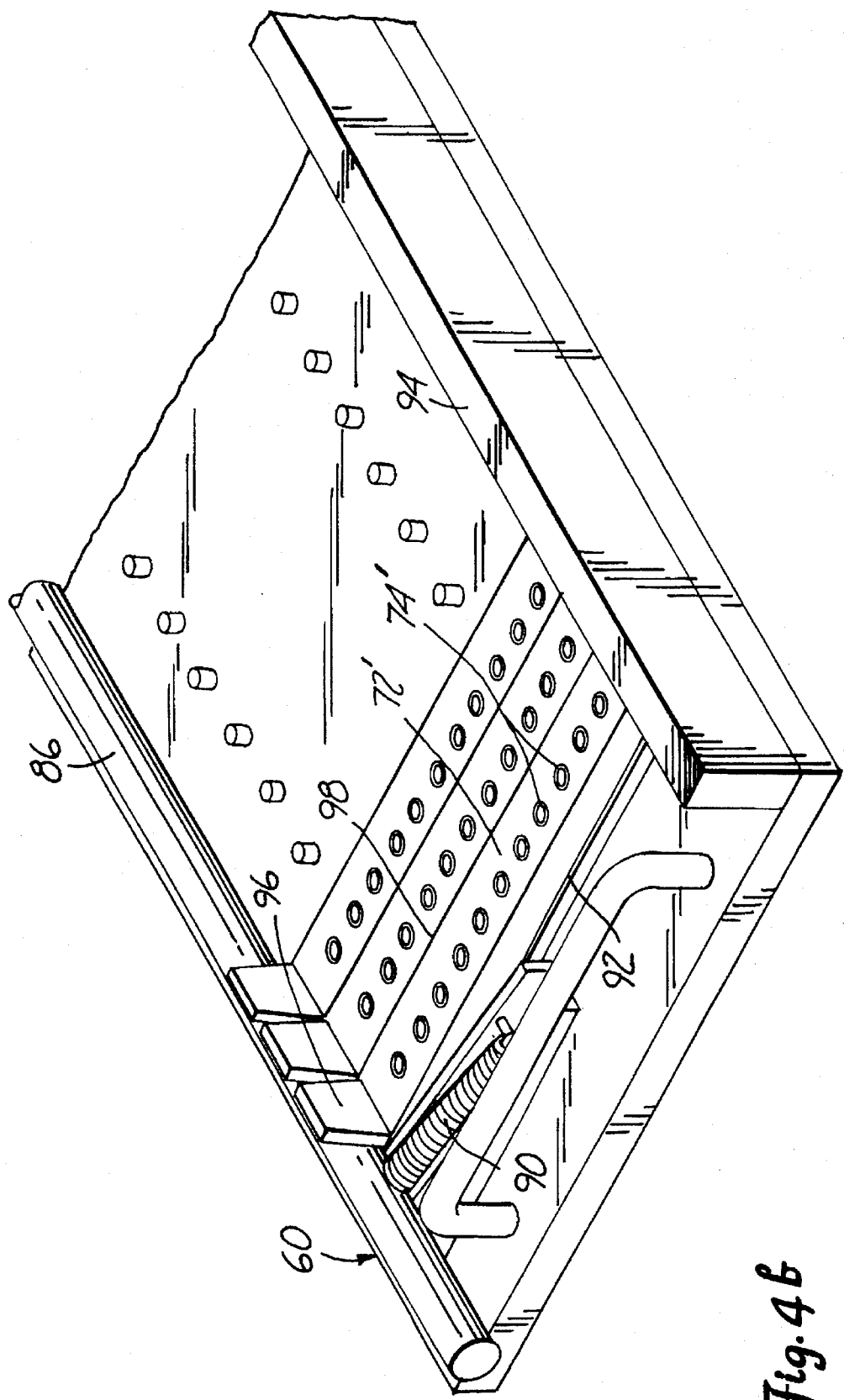

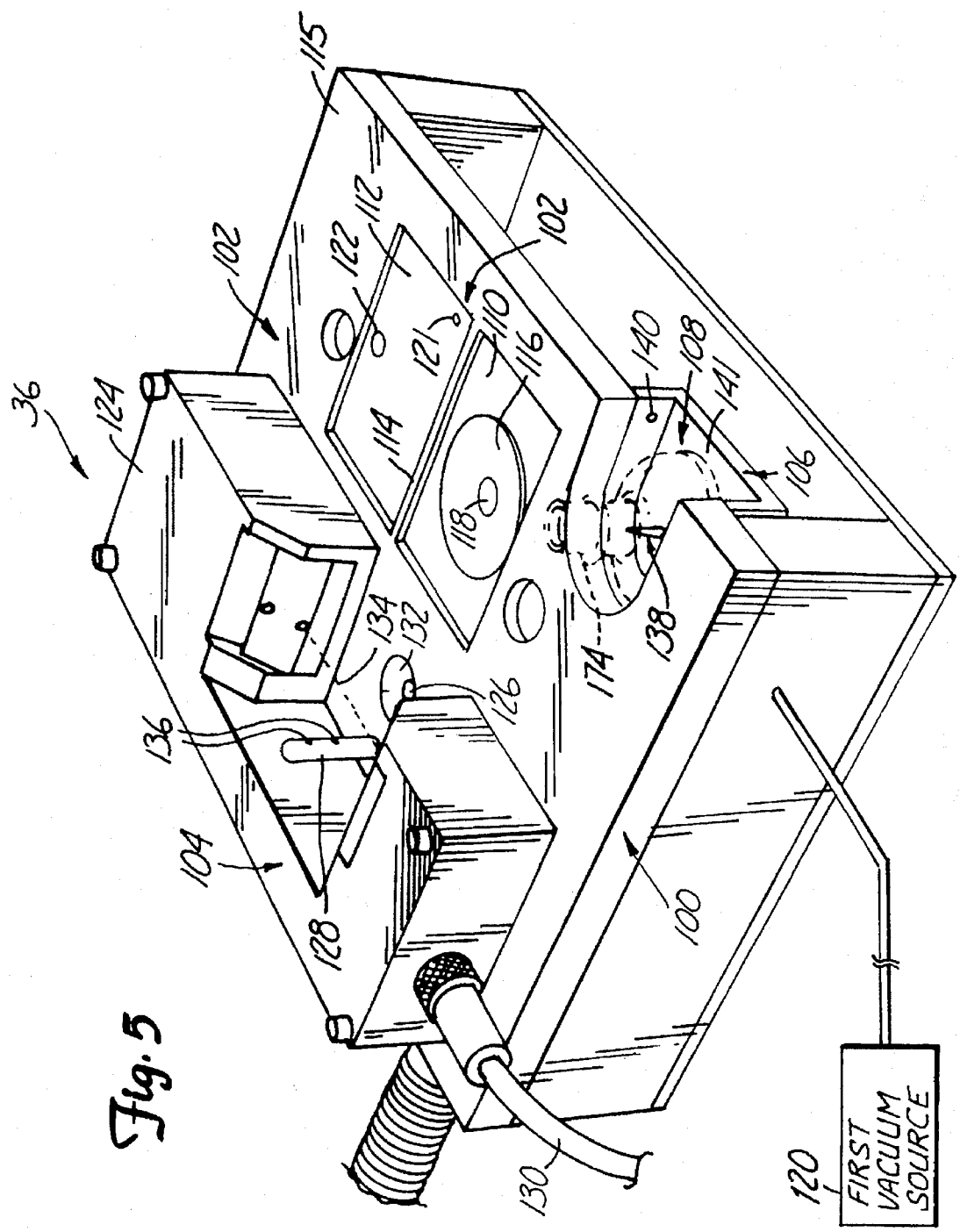

METHOD AND APPARATUS FOR AUTOMATED VERIFICATION AND LOADING OF PRECISION DRILL BITS INTO A DRILLING MACHINE PACKAGE

BACKGROUND OF THE INVENTION

The present invention concerns a method and apparatus for automatically verifying and loading precision drill bits into a drilling machine package. More particularly, it relates to an apparatus which transfers drill bits from pre-configured drill bit containers to a diameter verification station and then to ready-for-use, printed circuit board drilling machine packages.

The manufacture of printed circuit boards (PCBs) has experienced considerable improvement over the past 25 years. Technological advancements in chemistry, machinery, and materials have resulted in an ability to consistently produce large volumes of PCBs with dense circuitry patterns on a highly efficient basis.

One particular area of progress has been in the PCB drilling process. An individual circuit board has literally thousands of drilled holes. As normal fabrication techniques place several circuit boards on a panel for processing, a single panel can have tens of thousands of drilled holes. These holes are used to connect components to the board and to various circuitry traces, to connect the circuitry traces of one layer to another, to provide reference points for subsequent processing, and to assist in mounting the completed circuit board within its final housing.

Drill bits used in drilling PCBs are made of a strong, wear resistant material, such as tungsten carbide. While this material is resistant to wear, after a certain number of drilled holes ("hits"), the drill bit will deteriorate and will no longer be sharp enough to maintain the diameter and tolerance requirements for subsequent holes. Accounting for drill bit deterioration during processing is highly important as oftentimes, a particular panel requires hundreds of holes of the same diameter. Becuase of wear, single drill bits will be unable to drill all holes within tolerances. Through experience, circuit board manufacturers have approximated the rate at which drill bits dull. Thus, based upon this wearing rate, the drill bit is replaced after a certain number of hits.

The drilling requirements for jobs vary, but generally, differently sized (diameter) holes, and thus differently sized drill bits, are employed. Currently, approximately 255 standard sized drill bits are available, ranging from 0.002 inches to 0.2610 inches in diameter. A normal drilling job requires holes, and therefore drill bits, of several different diameters. Further, due to the known wear of drill bits, the tolerance specifications for the job will demand the use of a number of same diameter drill bits. Thus, during the course of a normal job, a drilling machine will be required to make a number of drill bit changes.

The first generation of drilling machines employed a single spindle device which was manually maneuvered by an operator to drill holes in a single circuit board. When job specifications called for the use of multiple drill bits, the operator was required to change drill bits by hand. Later, several spindle s were linked to one another so that more than one panel could be drilled at a time. Modern drilling machines employ multiple spindles and a movable work table to which the panels are secured. Via computer numerical control (CNC), the automated work table and attached panels are moved beneath the spindles for drilling the necessary holes.

Along with properly positioning panels for each drilled hole, the CNC drilling machine similarly automates the change of drill bits. For the CNC machine to replace drill bits on an automated basis, each individual drill bit must be stored on the work table at a pre-determined location, the coordinates of which are programmed into the drilling machine's memory.

During a drill bit change, the work table positions a new drill bit to be picked up directly below an associated spindle. To accomplish proper positioning, the drill bits for each job are grouped together on a cassette or package. For purposes of this specification, the terms "cassette" and "package" are used interchangeably, although a "package" is normally understood to mean a "cassette" that has been loaded with drill bits. The package has a plurality of drill bit receiving openings specifically arranged to maintain each individual drill bit at a standardized or known location. The drill bits are sequenced within the drilling package according to the hole diameters required by the PCB to be drilled. For example, a particular job may require the use of five drill bits of a first diameter, three drill bits of a second diameter and two drill bits of a third diameter. A drilling package having 10 consecutive drill bit openings would contain the first diameter drill bits in openings 1–5, the second diameter drill bits in openings 6–8, and the third diameter drill bits in openings 9–10. This sequence is programmed into the CNC drilling machine's memory so that when called for, the work table will precisely position the attached package beneath the spindle to deliver a drill bit of the desired diameter from the proper location in the package.

Configuration of drilling packages varies from manufacturer to manufacturer. A number of competing drilling machine manufacturers exist, such as Excellon Automation, DynaMotion, Hitachi, Posalux, and Advanced Controls. Each of these manufacturers have developed their own individual drilling package design. Each style of drilling package spaces the drill bit receiving openings differently and further employs unique row and column configurations for sequencing of drill bits. When a drilling machine retrieves a drill bit from a package, the computer-controlled movements are dictated by the assumed location of drill bits within the package attached to the work table. Thus, because of the variation in drilling package designs, a drilling machine for one manufacturer cannot properly function with another's drilling package as the drill bits will not be located in the position pre-programmed into the CNC drilling machine's memory.

While the drilling process itself has been automated, actual loading of drilling packages remains primarily a manual operation. As previously described, a machine-ready drilling package is comprised of a base cassette loaded with drill bits of specific diameters in a specific sequence according to job requirements. Manual loading of a drilling package requires an operator to first retrieve the proper manufacturer's drilling package based upon the type of drilling machine to be used. Next, an appropriate number of drill bits of each diameter required by the job must be selected. Prior to the loading process, drill bits are stored in a drill bit container. A drill bit container holds a number of drill bits of a same diameter, this diameter being plainly designated on the drill bit container itself. The operator manually transfers the required number of drill bits from each drill bit container and places them in the appropriate sequence within the drilling package.

The manual loading of drilling packages is a tedious process. Because the operator is required to make numerous decisions as he or she loads the drilling package on a repetitive basis, the opportunity for human error is quite prevalent. For example, drill bits of the wrong diameter may be erroneously selected and loaded. Similarly, an incorrect number of drill bits of a certain diameter might be placed in the package. Further complicating the manual loading of drilling packages is the fact that it is often quite difficult to visually detect an error in loading. Thus, mistakes in sequencing and/or drill bit diameter go unnoticed until the drilling process actually takes place. At this time, the results are usually quite damaging as a single hole or series of wrong diameter holes are drilled, severely damaging the circuit board(s) being operated on.

An additional problem with manual loading of drilling packages arises when drill bits of the wrong diameter have been placed within a drill bit container. When retrieving individual drill bits from a drill bit container, the operator assumes that the diameter designation is accurate for all drill bits contained therein. However, this is not always the case as drill bit containers can be mismarked. A similar problem occurs when re-sharpened drill bits are used. While the re-sharpened drill bits originally conformed in diameter to tolerances, the re-sharpening process may have dropped the drill bit out of tolerance. As time constraints do not allow the operator to verify the diameter of each drill bit being loaded, a mismarked or out of tolerance drill bit may erroneously be placed in a drilling package and go unnoticed until a PCB has been irreparably damaged.

A final concern associated with the manual loading of drilling packages is operator safety. Drill bit blades have sharp tips and, due to their inherently small diameters, are easily broken. These aspects present safety hazards to an operator as the drill bits are generally stored in both drill bit containers and drilling packages with the blade projecting outward. When reaching for an individual drill bit, it is quite common for the operator to contact other drill bit blades, causing painful cuts to the operator's fingers. Furthermore, the blade can break and become lodged in the finger, requiring medical attention for removal.

Manual loading of a drilling package with appropriately sized and sequenced drill bits is a labor intensive process, subject to numerous potential errors. Further, the inability to verify the diameter of each drill bit being loaded and operator safety presents additional concerns. Therefore, a substantial need exists for an automated drilling package loader, having the ability to verify the diameter of each drill bit being loaded along with accurately sequencing the drill bits within a variety of different manufacturer's drilling packages.

SUMMARY OF THE INVENTION

The invention provides a method and apparatus for automated verification and loading of precision drill bits from a drill bit container into a drilling machine package. Prior to placing each drill bit in an appropriate location within the drilling package, a diameter verification is provided. The method and apparatus of the present invention accurately compiles drilling machine packages with precision drill bits at a rapid rate. The chances of a wrong diameter drill bit being placed at a certain location within the drilling package are virtually non-existent as the diameter of each drill bit is measured and verified prior to loading. Finally, as the loading process is fully automated, operator contact with the drill bit blades does not occur, thus eliminating the injuries associated with manual loading.

The automated drilling package loading apparatus is comprised of an automated transfer machine, having a defined area of operation, connected to a control device. In a preferred embodiment, the automated transfer machine is a robotic arm. The apparatus further includes a package frame and a container receiving member located in the defined area of operation of the automated transfer machine. Finally, the apparatus includes a diameter sensing device which is operably associated with the automated transfer machine. The package frame is used to maintain at least one drilling package at a first position with respect to the automated transfer machine. The container receiving member is used to maintain at least one drill bit container at a second position with respect to the automated transfer machine. The diameter sensing device is used to sense and verify diameters of individual drill bits retrieved from the drill bit container.

The method of operation begins with the control device recalling information related to proper job sequencing and specific area locations. From this information, the automated transfer machine transfers a drill bit from the drill bit container to the diameter sensing device. The drill bit container holds a plurality of drill bits in a known arrangement. As the drill bit container is maintained by the container receiving member at the first position with respect to the robotic arm, the recalled information and control device enables the automated transfer machine to find the specific location of the drill bit contained therein. The diameter sensing device is operably associated with the automated transfer machine, so that the diameter sensing device can measure the diameter of the drill bit by way of the automated transfer machine.

After the diameter of the drill bit is measured, the automated transfer machine transfers the drill bit to a first drilling package. By way of the package frame, the first drilling package is located at the second position which is generally standardized with respect to the automated transfer device. As a drill bit receiving opening configuration within the drilling package is previously known, the location of each drill bit receiving opening is also generally standardized with respect to the automated transfer machine. The automated transfer machine then loads the drill bit into a first drill bit receiving opening in the drilling package.

In a preferred embodiment, the control device stores the position of the container receiving member, the drill bit container maintained thereon, the package frame, the drilling package, and the diameter sensing device, all with respect to the automated transfer device. Additionally, the control device stores information specific to the operation being performed. In particular, the type of drilling package being loaded, the required drill bit diameter(s), the proper sequencing of drill bits based upon the diameters, and the number of drilling packages to be loaded is stored. Thus, the preferred method of the present invention includes determining diameter, amount and sequence data of drill bits to be loaded into the drilling package.

BRIEF DESCRIPTION OF THE DRAWINGS

FIG. 4 is an exploded view of a package holding area portion of the apparatus of FIG. 1.

FIGS. 4a and 4b are enlarged perspective views of alternative embodiments of the package frame shown in FIG. 4.

FIG. 5 is an enlarged perspective view of a drill bit unloading and verification area portion of the apparatus of FIG. 1 including a diagrammatic view of a first vacuum source.

DETAILED DESCRIPTION OF THE PREFERRED EMBODIMENTS

Figure 1:
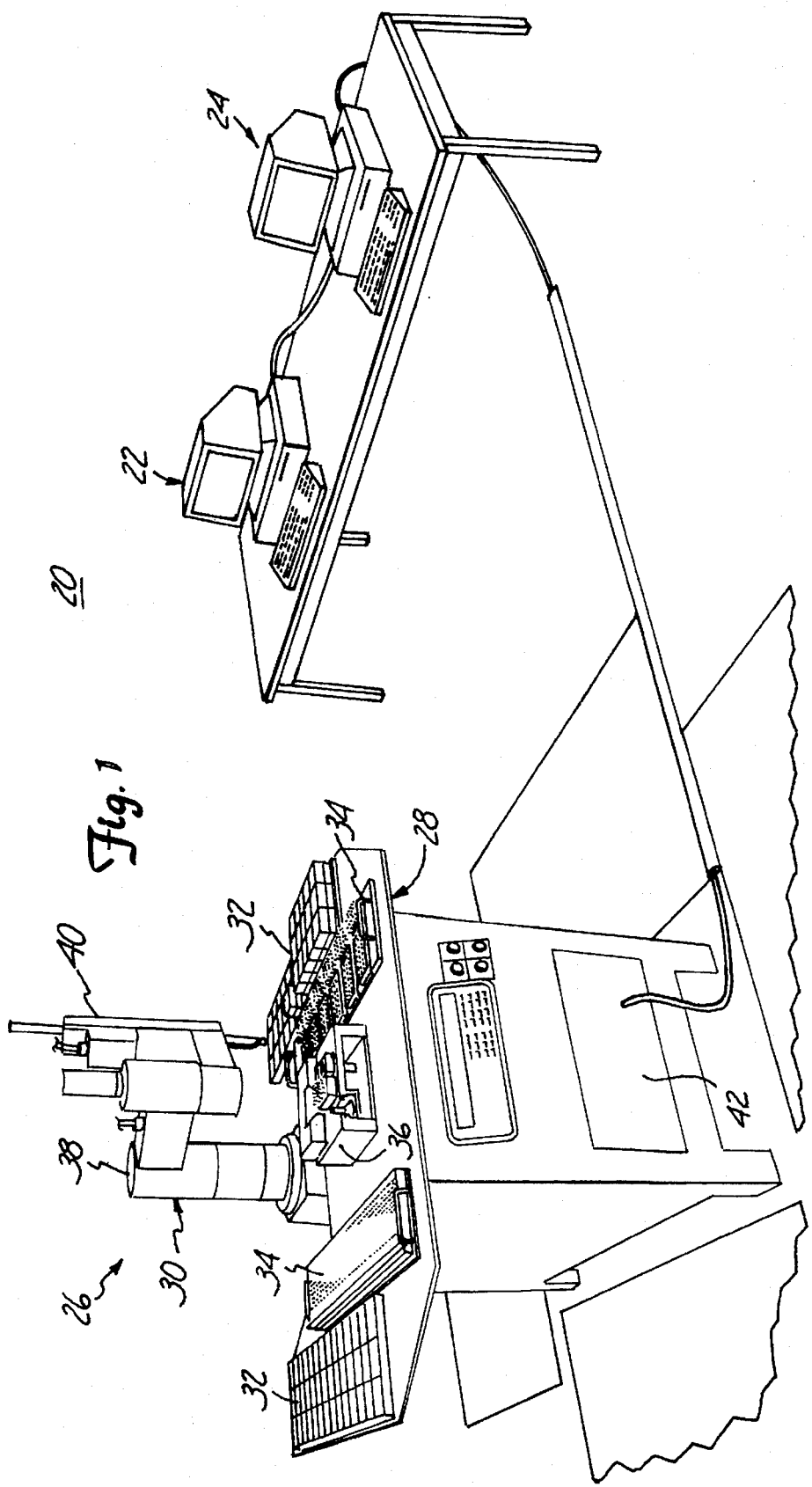
FIG. 1 is a perspective view of a preferred automated drilling package loading apparatus accordance with the present invention.

A preferred embodiment of the drilling package loading apparatus 20 of the present invention is shown in FIG. 1. The apparatus 20 includes a data input station 22, a sequencing station 24 and a processing station 26. The data input station 22 is a controller which is programmed to receive, process, and transmit various data and is linked to the sequencing station 24. The sequencing station 24 is also a controller, programmed to convert data provided from the data input station 22 into machine readable language. The sequencing station 24 is linked to the processing station 26. In a preferred embodiment, the data input station 22 and the sequencing station 24 are computers. However, any other device or devices capable of compiling and processing data are acceptable.

The processing station 26 is comprised of a work table 28 and an automated transfer machine 30. The work table 28 contains several processing areas including a container storage area 32, a package holding area 34 and a drill bit unloading and verification area 36. In the preferred embodiment, the automated transfer machine 30 is a robotic arm which includes a maneuverable base 38 having an attached working shaft assembly 40, and a robotic controller 42 which is linked to the sequencing station and controls the motions of the maneuverable base 38 and the working shaft assembly 40. Alternatively, the automated transfer machine 30 can be a pick-and-place machine, or any other device having the ability to grasp and maneuver drill bits.

Figure 2:
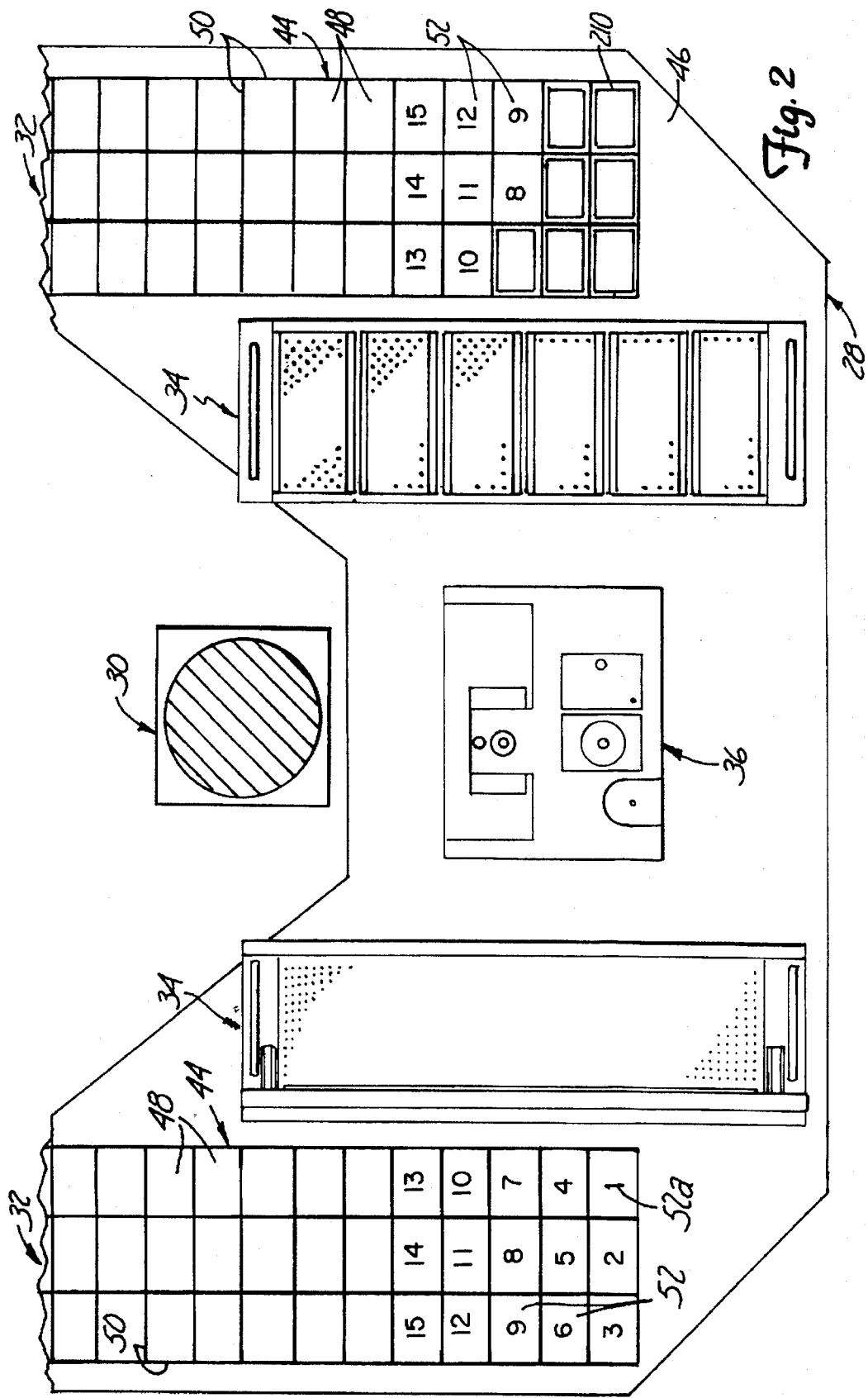
FIG. 2 is an enlarged, top plan view of a worktable portion of the apparatus FIG. 1 including a top sectional view of the robotic arm.

The work table 28 surrounds an area of operation of the automated transfer machine 30, as depicted in FIGS. 1 and 2. With this configuration, the working shaft assembly 40 can access and interact with the container storage area 32, the package holding area 34 and the drill bit unloading and verification area 36. While the preferred embodiment of the work table 28 is shown as having two container storage areas 32 and two package holding areas 34 symmetrically arranged about the preferred automated transfer machine or robotic arm, other layouts are equally acceptable. For example, only one container storage area 32 and one package holding area 34 is necessary.

In the preferred method of operation, the robotic controller 42 receives processing data from the sequencing station 24. From this information, the robotic controller 42 directs the working shaft assembly 40 to the container storage area 32 to retrieve a container which is then transferred to the drill bit unloading and verification area 36. A precision drill bit (not shown) is selected by the working shaft assembly 40 for diameter verification. Finally, the working shaft assembly 40 is maneuvered to load the precision drill bit at the package holding area 34.

1. Container Storage Area 32

Figure 3:
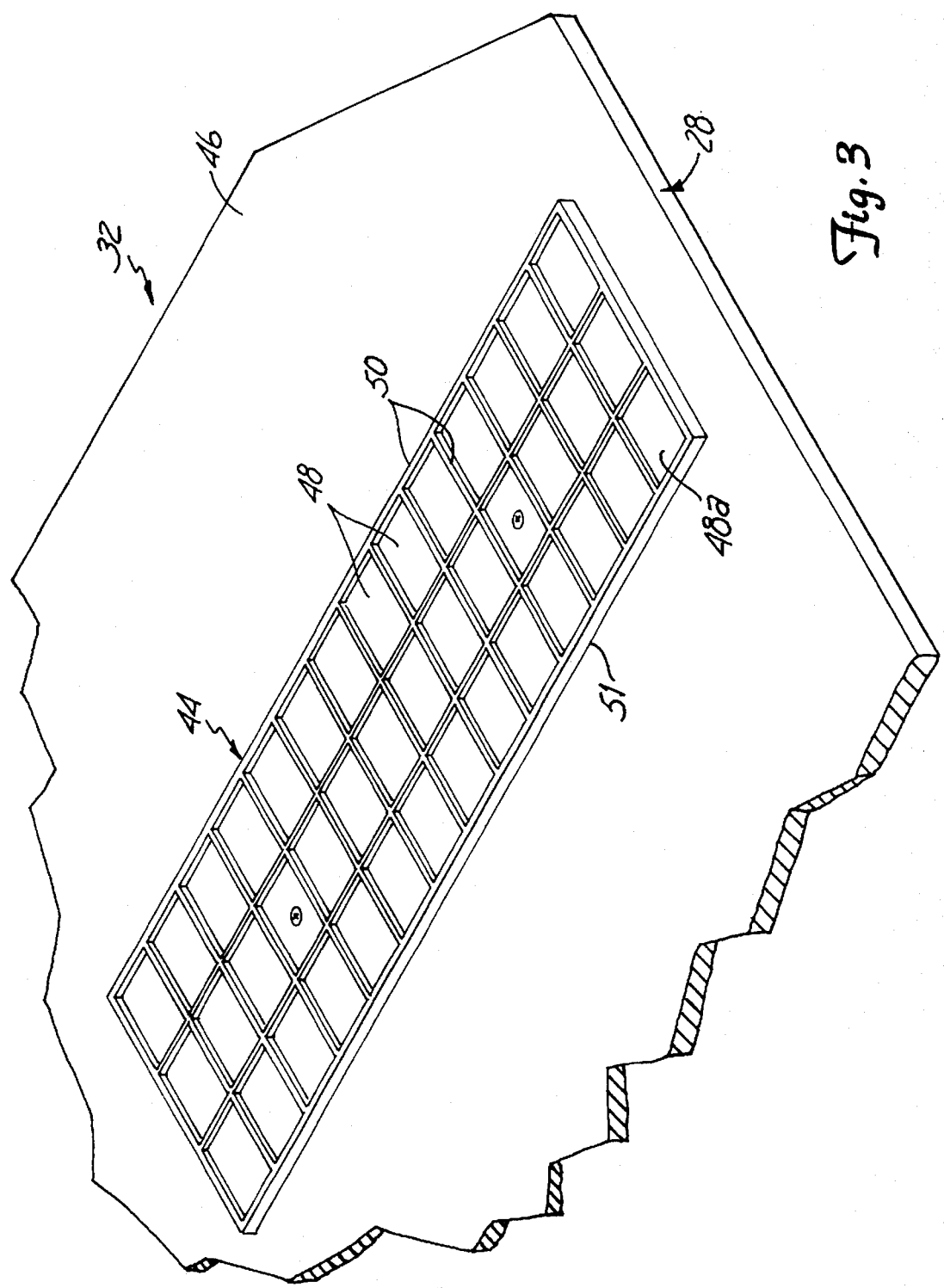
FIG. 3 is an enlarged perspective view of a container storage area portion of the apparatus of FIG. 1.

As shown in FIGS. 2–3, the container storage area 32 includes a container tray 44 attached to a top surface 46 of the work table 28. For purposes of clarity, the work table 28 of FIG. 3 is shown without the package holding area. In the preferred embodiment, the container tray 44 is a frame having a plurality of equally sized openings 48. The openings 48 are defined by frame walls 50 which project upwardly from a base 51 (FIG. 3). The openings 48 are sized to receive and hold in a set position a plurality of drill bit containers (not shown). Thus, each opening 48 is approximately 3 inches in length and 2 inches in width. Alternatively, the openings 48 can assume any size sufficient for receiving and maintaining a drill bit container at a definable position.

As shown in FIG. 3, the container tray 44 is specifically positioned on the work table 28. While the actual distance from the preferred automated transfer machine or robotic arm 30 can vary, the container tray 44 must be within an area accessible by the robotic arm 30. The actual location is stored in the robotic controller (42 in FIG. 1). In addition, the openings 48 are labeled with character designations 52. The character designations 52 serve to indicate proper sequential location of drill bit containers 210 in the various openings 48. As will later be described, the robotic arm 30 will selectively retrieve drill bit containers from the container storage area 32. The sequence of this retrieval will coincide with the character designations 52. In other words, retrieval will begin with a first opening 48a marked with a character designation "1 (shown as 52a in FIG. 2). Subsequently, retrieval from the successively designated openings 48 will follow. While the container tray 44 is shown as being fixed to the top surface 46, the container tray 44 can be designed for simple removal. In other words, the drill container tray 44 can be provided with handles or other grasping means and be removably attached to the top surface 46 of the work table.

2. Package Holding Area 94

As shown in FIG. 4, the package holding area 34 includes a package frame 60 and a receiving area 62 located on the work table 28. Notably, the work table 28 of FIG. 4 is depicted without the container tray for ease of understanding. Basically, the package frame 60 consists of a base 64, a pair of handles 66 and two legs 68. The legs 68 are sized to fit within two frame receiving holes 70 in the receiving area 62. The package frame 60 is frictionally secured to the receiving area 62 by engaging the legs 68 within the two frame receiving holes 70.

The frame receiving holes 70 maintain the package frame 60 at a consistent location on the work table 28. In other words, the legs 68 are placed on the package frame 60 such that the package frame 68 is always positioned at the same location on the work table 28, regardless of the overall package frame 60 construction. However, configuration of the package frame 60 itself will vary depending on job requirements. As different drill machine manufacturers require different package styles, construction of the package frame 60 must vary accordingly.

Figure 4A:
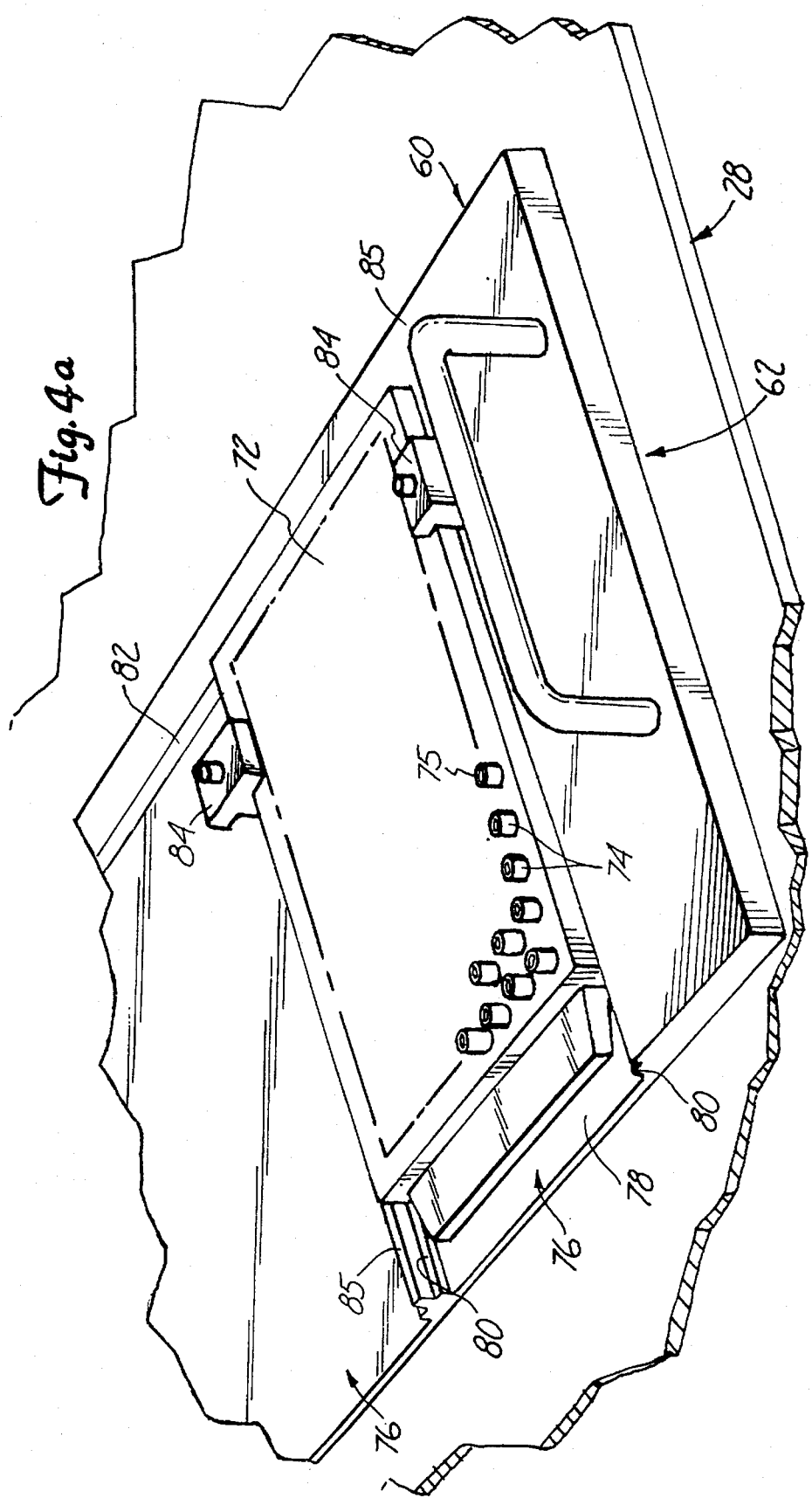

An example of a more detailed package frame 60 configuration is shown in FIG. 4a. The package frame 60 of FIG. 4a is designed to hold cassettes 72 for drilling machines manufactured by Excellon Automation. For purposes of clarification, it should be remembered that the terms "cassette" and "package" may be used interchangeably. The Excellon Automation cassettes 72 contain a plurality of receiving members 74, each having a rim 75, sized to receive drill bits (not shown). Arrangement and spacing of the receiving members 74 on each cassette 72 manufactured by Excellon Automation is standardized. Each cassette 72 is secured to the package frame 60 within a pocket 76. The pocket 76 is defined by a bottom surface 78, a pair of shoulders 80, and a stopping wall 82. Further, tabs 84, which are attached to a top surface 85 of the package frame 60 and project across a portion of the pocket 76, assist in holding the cassette 72 in the pocket 76. The pair of shoulders 80 are sized according to a corresponding shape of the Excellon Automation cassette 72. The cassette 72 is secured to the package frame 60 by sliding the cassette 72 along the bottom surface 78 and the pair of shoulders 80 of the pocket 76 until the cassette 72 abuts the stopping wall 82. The cassette 72 is maintained in the pocket 76 by the tabs 84 via fictional contact. Through this construction, each cassette 72, and thus the related receiving members 74, are maintained in a known position with respect to the package frame 60. Likewise, when the package frame 60 is placed on the work table 29 in the receiving area 62, the cassettes 72 are maintained in a known position with respect to the robotic arm (30 in FIG. 2).

While the package frame 60 of FIG. 4a is shown as securing one cassette 72, any number may be stored. Further, while the package frame 60 preferably employs the pocket 76 and the tabs 84 to engage the cassette 72, any other means of attachment may be used.

An alternative embodiment of the package frame 60 is shown in FIG. 4b which is designed for use with cassettes manufactured by DynaMotion. As opposed to the cassette 72 manufactured by Excellon Automation, a DynaMotion cassette 72', shown in FIG. 4b, contains a single row of drill bit receiving holes 74'. The package frame 60 used to maintain the position of each cassette 72' includes a holding rod 86, a spring 90, a shoulder 92 and a stopping wall 94. The spring 90 is attached at one end to the base 64 and to the holding rod 86 at the opposite end. The cassette 72' manufactured by DynaMotion includes a finger 96 projecting upwardly from a base 98. The cassette 72' is placed into the package frame 60 by aligning the base 98 against the shoulder 92. Subsequent cassettes are similarly aligned against a previous cassette (72' for example). To ensure that each cassette 72' abuts the stopping wall 94, the finger 96 is nested against the holding rod 86. Once so placed, the holding rod 86 is biased against the finger 96 of each cassette 72' by the spring 90. This biasing in mm forces each cassette 72' to abut the stopping wall 94.

With the above-described configuration, the cassettes 72' are maintained at a constant position with respect to the package frame 60. A series of cassettes 72' may be secured to the holding rod 86 by placing consecutive cassettes 72' against one another. When the package frame 60 is placed in the receiving area 62 of the work table (28 in FIG. 4), the cassettes 72' and the drill bit receiving holes 74' will be in a known location with respect to the robotic arm (30 in FIG. 2).

While the package frame 60 depicted in FIG. 4b has been described as incorporating the holding rod 86 and spring 90 configuration, other mounting means are available. Further, other package frame 60 configurations can be used in addition to those shown in FIGS. 4a and 4b to accommodate other manufacturer's cassettes.

3. Drill Bit Unloading And Verification Area 36

As shown in FIG. 5, the drill bit unloading and verification area 36 includes a platform 100, a container holding shoe 102, a diameter sensing device 104 and a foot holding area 106. The platform 100 is attached to the work table (28 in FIG. 2) and extends upwardly therefrom. The drill container holding shoe 102 and diameter sensing device 104 are integrally attached to the platform 100. The foot holding area 106 is defined by a recessed area 108 in the platform 100.

The container holding shoe 102 is comprised of two sections, a bottom receiver 110 and a cover receiver 112. A dividing wall 114 separates the bottom receiver 110 and the cover receiver 112. The bottom receiver 110 is a rectangular shaped indentation in a top surface 115 of the platform 100. The bottom receiver 110 additionally includes a rubber cup 116 having an air tube 118 located at its center. The air tube 118 is connected to a first vacuum source 120. The bottom receiver 110 is designed to receive and maintain a bottom portion of a drill bit container (not shown). In the preferred embodiment, the bottom receiver 110 has a length of about 3 inches, a width of about 2 inches and a depth of about 0.25 inches. Alternatively, other dimensions can be used to accommodate various drill container sizes. The rubber cup 116, air tube 118 and first vacuum source 120 work in conjunction to secure a drill bit container within the bottom receiver 110. Any other type of holding device, including a frictional fit, is equally as acceptable.

Similar to the bottom receiver 110, the cover receiver 112 is a rectangular shaped indentation in the top surface 115 of the platform 100. The cover receiver 112 includes an optical sensor 121 and an ejector pin 122, and is sized to receive and maintain via a fictional fit with a cover portion of a drill bit container (not shown). In the preferred embodiment, the cover receiver 112 has a length of about 3 inches, a width of about 2 inches and a depth of about 0.25 inches. Alternatively, any other dimensions are equally acceptable. The optical sensor 121 is used to sense placement of an article within the cover receiver 112. The ejector pin (shown in a retracted position in FIG. 5) will dislodge items from the cover receiver 112. Additional attachment means can also be provided with the cover receiver 112.

The diameter sensing device 104 is comprised of a laser scanner 124, a rotatable bearing 126 and a cleaning device 128. The laser scanner 124 is attached to the top surface 115 of platform 100 and employs a laser beam and reflector mechanism to measure drill bit diameters. The laser scanner 124 is connected via wires 130 to an external processing device (not shown) which transforms the measurement into a diameter reading. In a preferred embodiment, the laser scanner 124 is a Keyence LS-3034 laser scanner. However, any other laser scanners or other diameter measuring devices can be used. The rotatable bearing 126 is located in a tapered hole 132 in the top surface 115 of the platform 100. The rotatable bearing 126 is located centrally along a laser path 134 of the laser 124, and has an opening of approximately 0.25 inches. An attached external servo motor (not shown) imparts a rotational force upon the rotatable bearing 126. The cleaning device 128 is preferably a closed tube projecting upwardly through the top surface 115 of the platform 100. The cleaning device 128 is positioned adjacent to the rotatable bearing 126. The cleaning device 128 has several air ports 136 through which air forced into the cleaning tube 128 is directed across the rotatable bearing 126. The air ports 136 are preferably located approximately 2 inches above the top surface 115 of the platform 100 although any other position is equally as acceptable. Further, other types of cleaning devices 128, such as gas, liquid, etc. can be used. In the alternative, the cleaning device 128 can be omitted.

While the diameter sensing device 104 of the preferred embodiment is described as having a single rotatable bearing 126, other configurations are equally acceptable. For example, a cylindrical carriage having a number of differently sized bearings 144 can be employed. With this configuration, differently sized drill bits, both in length and shank diameter, will be properly positioned for scanning by the laser scanner 124.

The foot holding area 106 maintains a foot 174 (shown with dotted line in FIG. 5) when not in use. As will later be described, the foot 174 is designed to assist in transferring drill bit containers, and must be stored at a known location when not used for that purpose. The foot holding area 106 includes a guide pin 138 and a fiber optic sensor 140. The guide pin 138 is attached to and projects upwardly from a center portion of floor. The fiber optic sensor 140 is located to the side of the guide pin 138 and is connected to an external processor (not shown) for detecting presence of a body in the foot holding area 106.

4. Working Shaft Assembly 40

Figure 6:
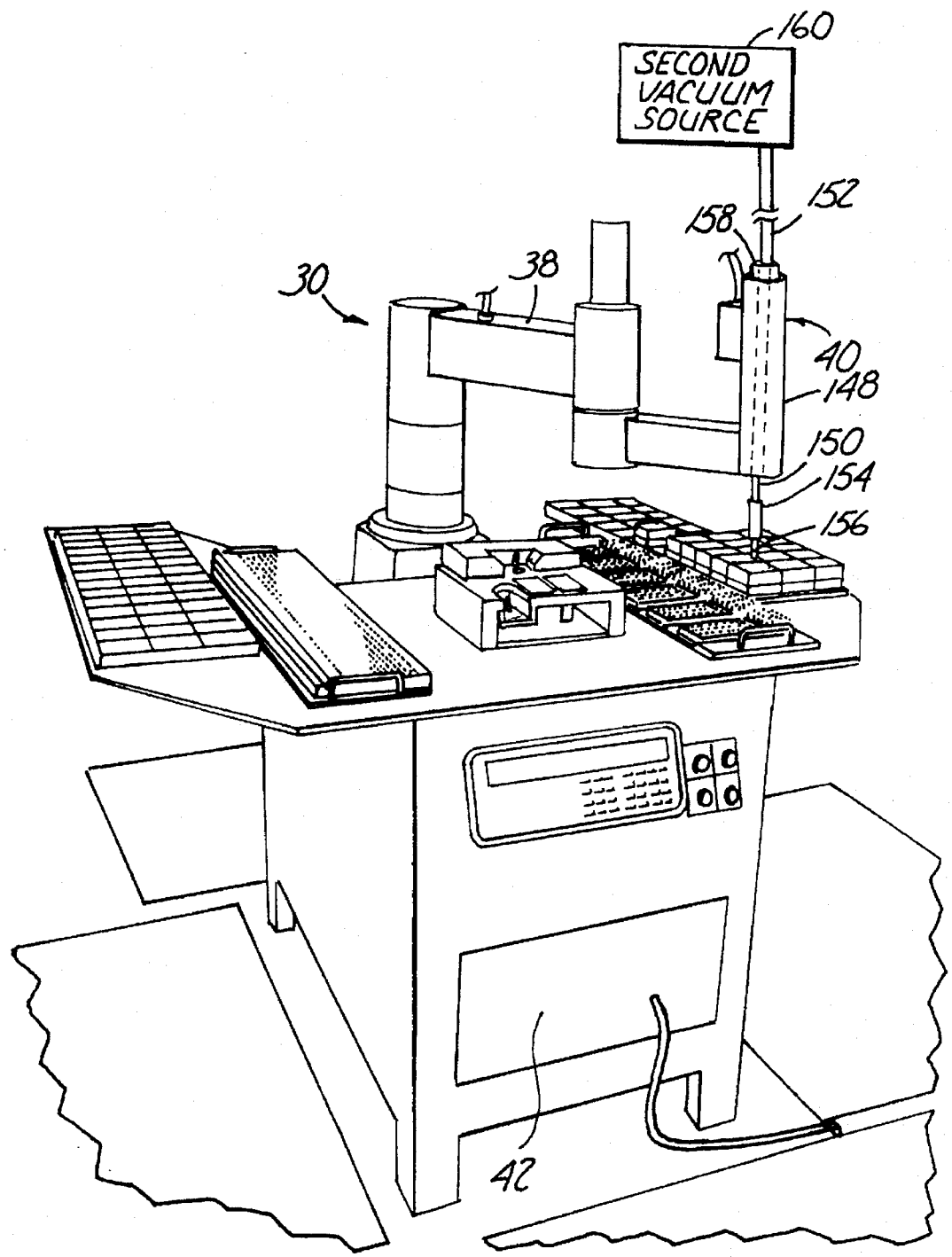
FIG. 6 is an enlarged perspective view of the processing station portion of the apparatus of FIG. 1 including a diagrammatic view of a second vacuum source.

In the preferred embodiment, the robotic arm 30 in FIG. 6 is a Seiko D-Tran TT 8030. Robotic arms are well known in the art and types other than that disclosed in the preferred embodiment are equally acceptable. As illustrated in FIG. 6, the maneuverable base 38 of the robotic arm 30 maneuvers the working shaft assembly 40 in a horizontal plane whereas the working shaft assembly 40 has a servo motor (not shown) for movement in a vertical direction. Movement of the working shaft assembly 40 is directed by the robotic controller 42.

The working shaft assembly 40 includes a guard 148, a directional shaft 150, an air tube 152, a head 154, and a collet 156. The guard 148 surrounds the directional shaft 150 and serves to protect users from injury during movement of the working shaft assembly 40. The air tube 152 is sealed to the directional shaft 150. To prevent damage to the air tube 152 during movement of the directional shaft 150, a guide 158 is provided, which extends upwardly from the guard 148. The air tube 152 is further connected on an opposite end to a second vacuum source 160 (shown in block form). The collet 156 is attached to and extends downwardly from the head 154. In the preferred embodiment, the directional shaft 150 is constructed of a stainless steel material while the air tube 152 is plastic.

Figure 7:
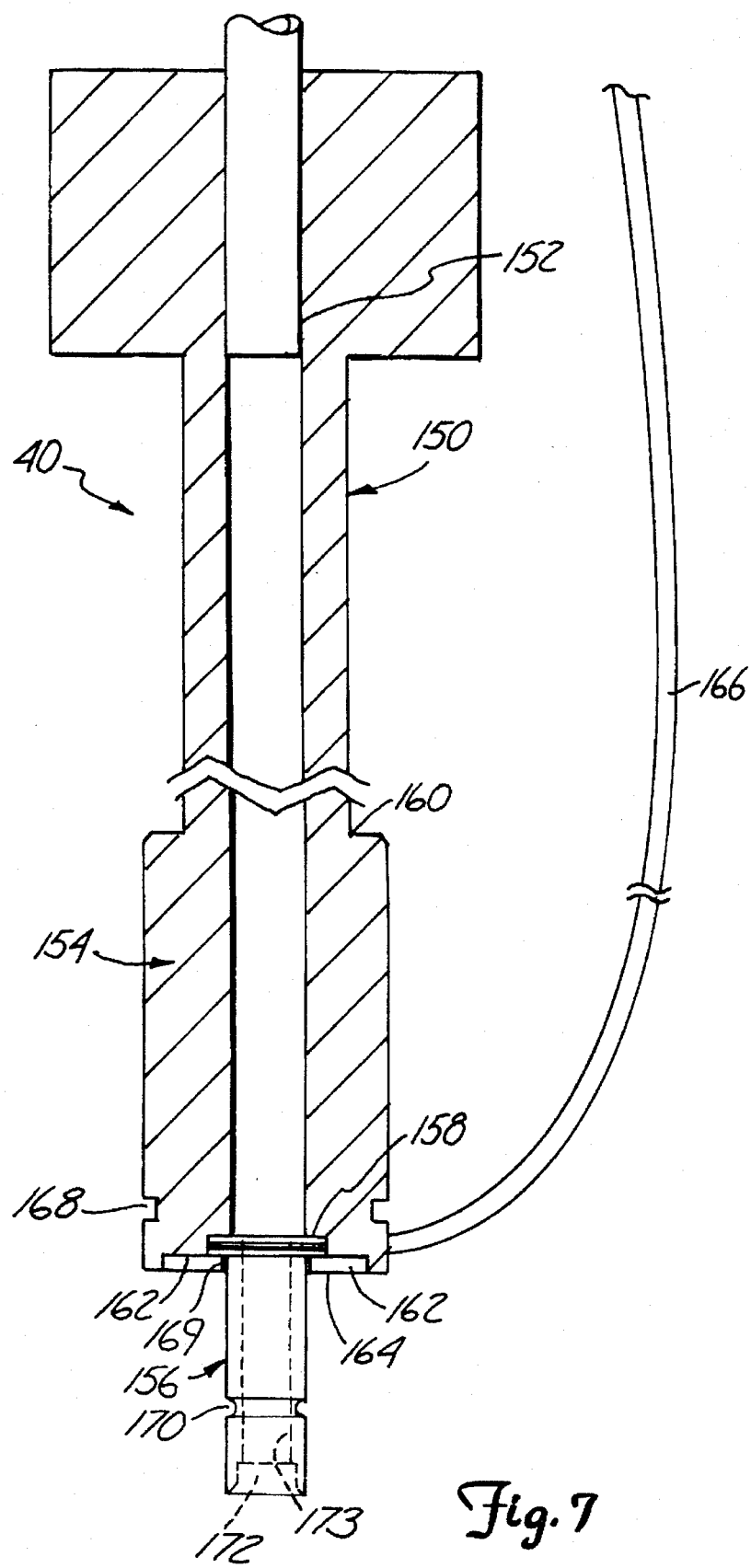
FIG. 7 is an enlarged side sectional view of a working shaft assembly portion of the apparatus of FIG. 1 with the guide removed.

FIG. 7 provides a more detailed view of the working shaft assembly 40 in cross-section with the guard 148 removed. The head 154 is substantially cylindrical in shape and has a three axis sensor 162 internally secured to a lower portion 164 of the head 154. The three axis sensor 162 is spring loaded so as to sense pivoting of the collet 156 within the head 154. A wiring system 166 connects the three axis sensor 162 to an external tripping device (not shown). The head 154 further includes an annular notch 168 along an outer circumference of the head 154. As will later be explained in detail, the annular notch 168 assists in the loading process.

The head 154 and the collet 156 are preferably manufactured as a single piece. The collet 156 rests on the three axis sensor 162 and projects downwardly from an opening 169 in the head 154. The collet 156 is substantially cylindrical in shape with an annular groove 170 on its outer circumference and a beveled tip 172 forming an internal aperture 173. The aperture 173 of the collet 156 is sized to receive and maintain a precision drill bit and has an outer diameter of about 0.354 inches and an inner diameter of about 0.25 inches, while the beveled tip 172 is about 0.30 inches in diameter. Other dimensions which allow for insertion and pick up of a precision drill bit are equally acceptable.

As later detailed, the preferred collet 156 is designed to hold a precision drill bit via vacuumed air from the second vacuum source (160 in FIG. 6). However, the collet 156 can be replaced by any of a number of different grippers designed to grab a precision drill bit. For example, the gripper can be a mechanical claw, having two opening walls which open and close to grasp a precision drill bit. Other pneumatic or hydraulic driven devices are equally as acceptable.

The collet 156 interacts with the three axis sensor 162 to prevent damage from occurring when operation of the working shaft assembly 40 erroneously causes the collet 156 to forcibly move within the head 154. In other words, the collet 156 is constructed to pivot slightly within the head 154. When this pivoting action approaches a level at which the collet 156 might incur damage, the three axis sensor 162 activates a tripping device (not shown), via the wiring system 166, which in turn causes the working shaft assembly 40 to cease movement.

Figure 8:
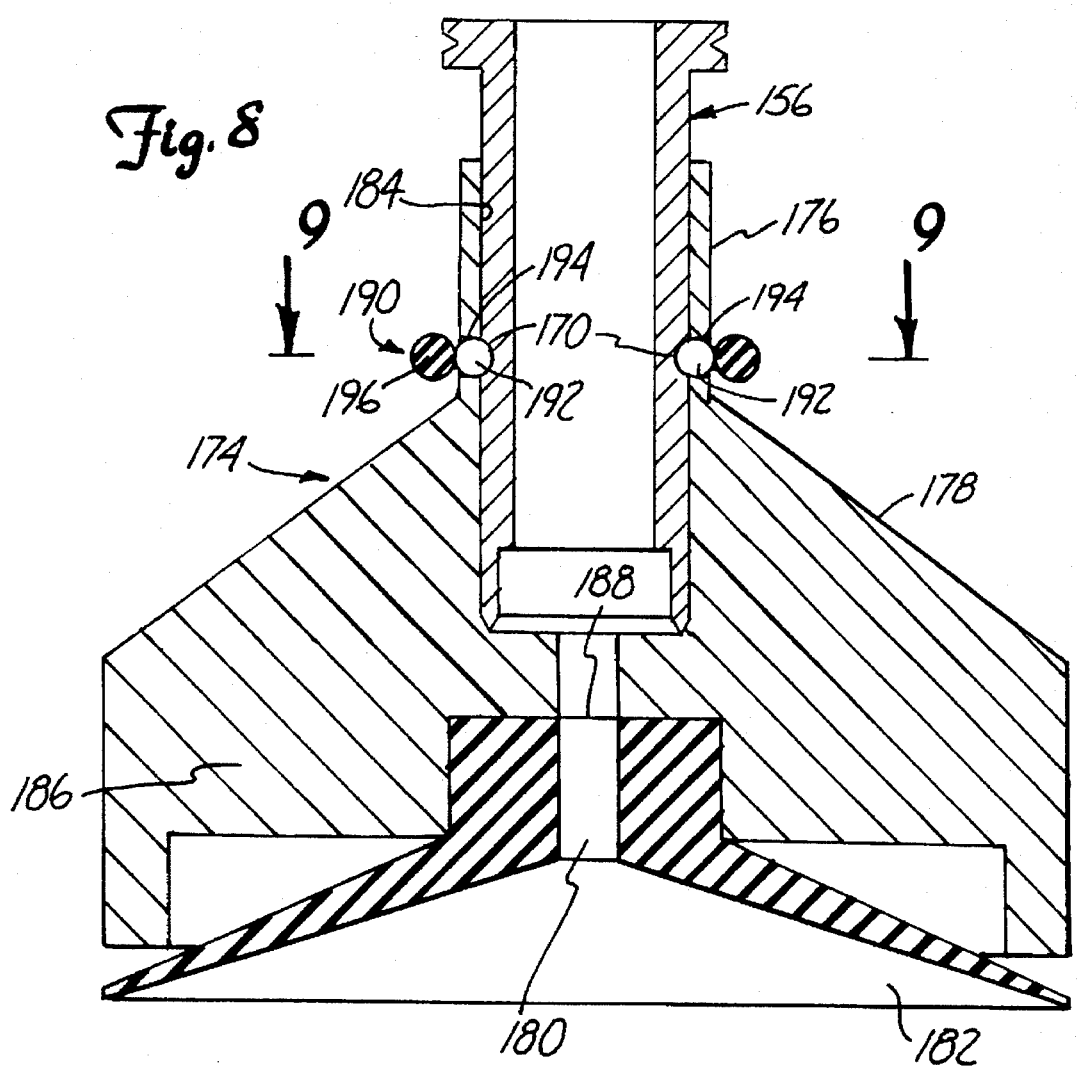
FIG. 8 is an enlarged side sectional view of a foot and collet portion of the apparatus of FIG. 1.

As shown in FIG. 8, a foot 174 can be removably coupled to the collet 156. The foot 174 is comprised of a neck 176, a conical housing 178, an air passage 180 and a suction cup 182. The neck 176 and the conical housing 178 are preferably manufactured as a single piece. The neck 176 has a centrally placed bore 184 which is sized for mounting around the collet 156. The bore 184 has a diameter of approximately 0.356 inches to properly accept the collet 156. The air passage 180 proceeds from the bore 184 to a bottom portion 186 of the conical housing 178. The suction cup 182 is attached to the bottom portion 186 of the conical housing 178 via a frictional fit with an opening 188. The air passage 180 interacts with the suction cup 182 at the opening 188. With this configuration, a pressure differential created by the second vacuum source (160 in FIG. 6) passes through the head 154 and collet 156 to produce a vacuum effect through the suction cup 182 via the passage 180.

Figure 9:
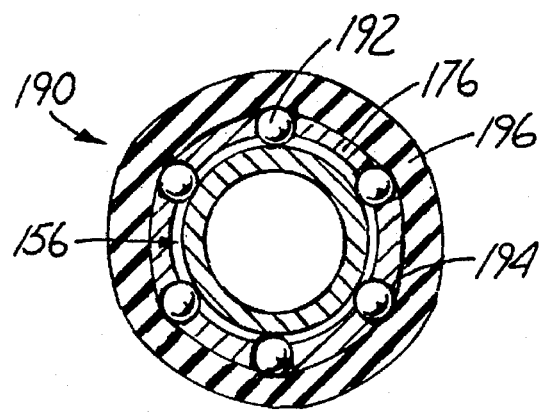
FIG. 9 is a sectional view of the foot and collet along the line 9—9 of FIG. 8.

To secure the foot 174 to the collet 156, the neck 176 has an attachment device 190. As shown in FIGS. 8 and 9, the attachment device 190 is comprised of several ball bearings 192 which partially pass through holes 194 in the neck 176 and an O-ring 196. The holes 194 allow a portion of the ball bearings 192 to project into the bore 184. However, the ball bearings 192 are sized such that they cannot pass completely through the holes 194. The ball bearings 192 are held within the holes 194 by way of the O-ring 196, which when placed around the neck 176, contacts an outer surface of each ball bearing 192. To attach the collet 156 to the foot 174, the collet 156 is placed within the bore 184 until the ball bearings 192 engage the annular groove 170 of the collet 156. The O-ring 196 selectively maintains this engagement by biasing the ball bearings 192 inward, fixing the foot 174 to the collet 156.

5. Drill Bit 200 And Drill Bit Container 210 Construction

Figure 10:
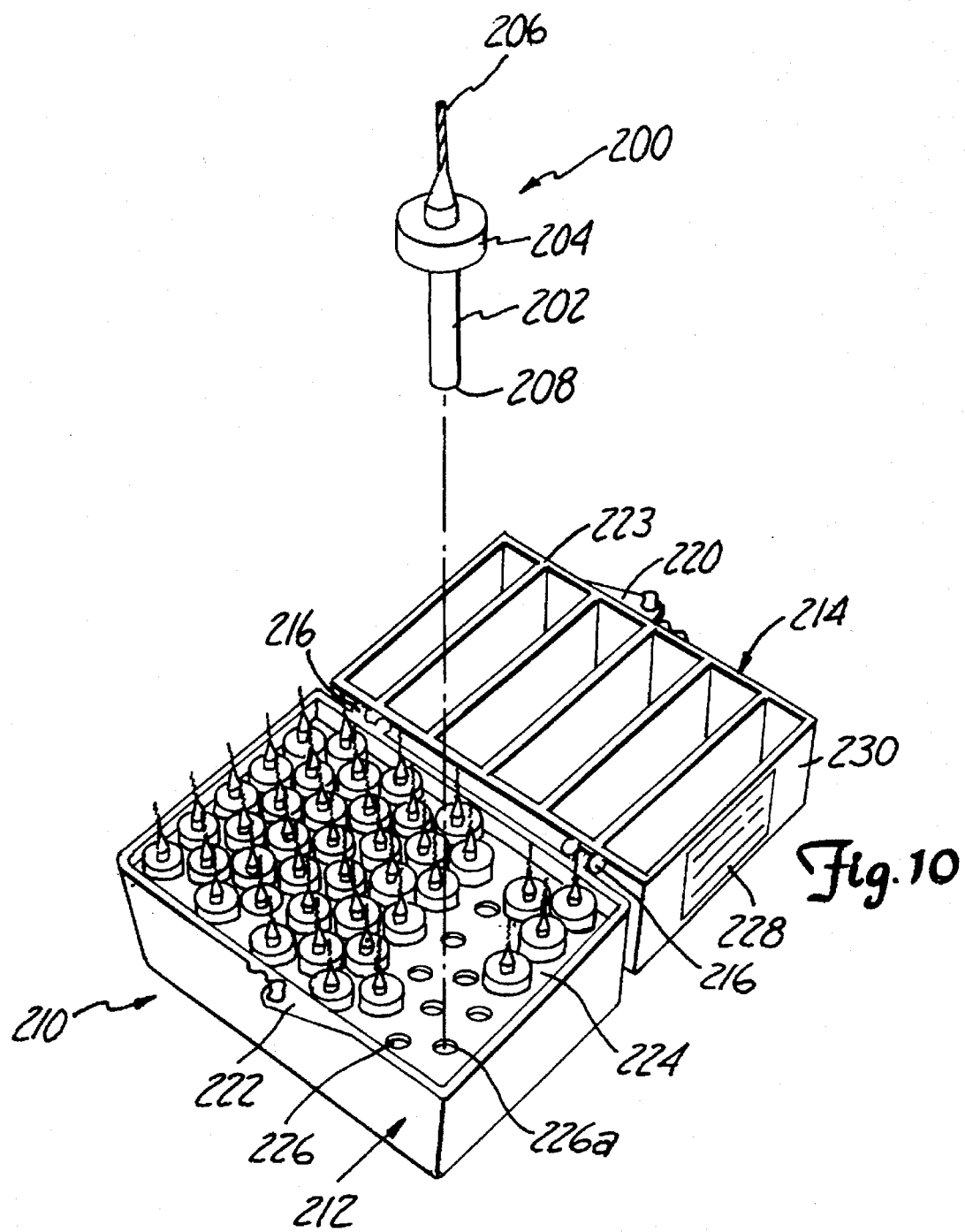
FIG. 10 is an exploded view of a drill bit container containing precision drill bits.

A drill bit for drilling printed circuit boards along with a storage container for drill bits is well known in the prior art. As shown in FIG. 10, a drill bit 200 is comprised of a shank 202, a setting ring 204 and a flute 206. The shank 202 and the flute 206 are manufactured as a single piece with the flute 206 being manufactured to have any number of different diameters. The setting ring 204 is placed along the shank 202 at a standardized position for subsequent use. Normally, the setting ring 204 is located 0.8 inches from an end 208 of the shank 202. The setting ring 204 is frictionally maintained at this position along the shank 202.

The drill bit 200 is stored in a drill bit container 210. The drill bit container 210 is comprised of a base 212 and a cover 214. The cover 214 is attached to the base 212 by a pair of hinges 216. To secure the cover 214 to the base 212, a first tab 220 of the cover 214 mates with a second tab 222 of the base 212. With this design, the drill bit container 210 can assume either an opened position or a closed position. The drill container 210 of FIG. 10 is in the opened position. Alternatively, the cover 214 can be pivotably rotated about the pair of hinges 216 in a direction (counterclockwise in FIG. 10) to the closed position in which a leading edge 223 of the cover is flush with the base 212.

The base 212 has a flat top surface 224 in which a plurality of drill bit receiving holes 226 are positioned. The drill bit receiving holes 226 have a diameter of approximately 0.25 inches and are large enough for the shank portion 202 of each drill bit 200 to pass through. However, the drill bit receiving holes 226 are smaller in diameter than the setting ring 204 of the drill bit 200. As shown in FIG. 10, the drill bit 200 is positioned within a first drill bit receiving hole 226a in an axial direction with the shank 202 being stored beneath the flat top surface 224 in the hole 226a. The setting ring 204 rests on the flat top surface 224 of the base 212. Thus, the flute 206 projects outwardly from the base 212.

The plurality of drill bit receiving holes 226 are specifically arranged in the flat top surface 224. The arrangement depicted in FIG. 10 provides ten rows of drill bit receiving holes 226 wherein each row has ten drill bit receiving holes 226. To reduce the overall size requirement for the drill container 210, each row is alternately offset. The configuration of the plurality of drill bit receiving holes 226 of FIG. 10 is standard in the art and is known as a "Fifty Pack" manufactured by Tycom Corporation. However, other drill bit receiving holes 226 configurations are equally acceptable so long as each of the plurality of drill bit receiving holes 226 is consistently located at a standardized position. Finally, industry standards dictate that all drill bits 200 contained in the drill bit container 210 be of essentially a same diameter. With this in mind, the drill bit container 210 has a diameter indication 228 located on a sidewall 230 of the cover 214 which plainly states the diameter of the drill bits 200 contained therein.

6. Method Of Operation

Figure 11:
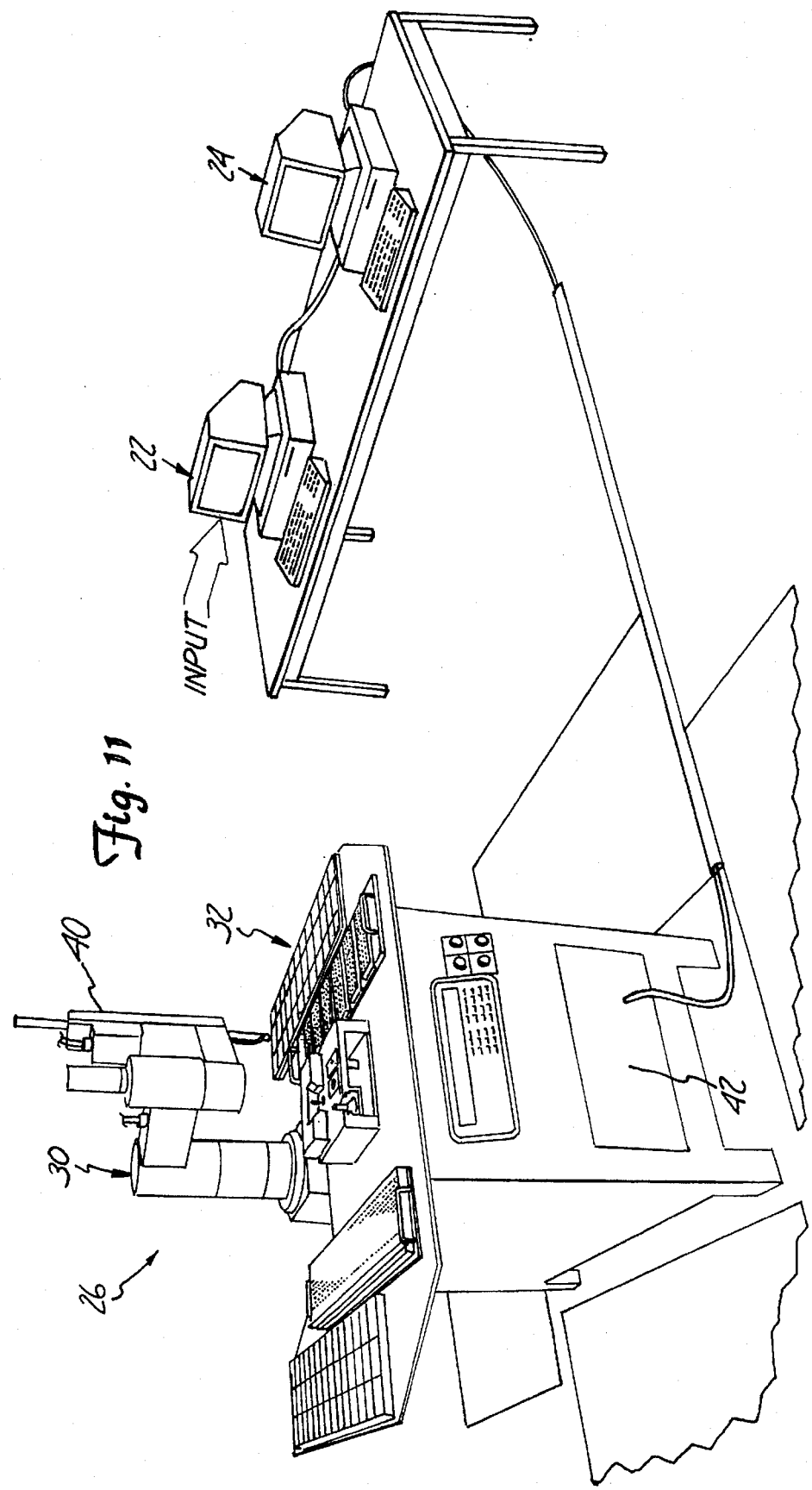
FIG. 11 is a perspective view of the apparatus of FIG. 1.

The method of operating the automated drill bit verifying and loading apparatus 20 is shown in FIGS. 11-25. The preferred method being with an operator providing job specific parameter information to the apparatus 20. More specifically, an operator (not shown) interfaces with the data input station 22 (shown generally in FIG. 11) to enter this information which includes the type of drilling machine and therefore drilling package to be used, various sizes of different holes to be drilled and therefore required drill bit diameters, quantity of holes to be drilled for each size or diameter, and sequence in which the holes will be drilled. From this information, the data input station 22, via a custom written software program, captures the exact configuration of a final drilling package, including type of package, diameter, quantity and sequence of drill bits contained on the package. Further, the data input station 22 formulates a corresponding sequence of drill bit containers in the container storage area 32 and the overall program for operation of the processing station 26. The data input station 22 transfers the created drilling package configuration and operation program in ASCII form to the sequencing station 24.

The sequencing station 24 translates the raw ASCII information from the data input station 22 into a machine readable language. More specifically, the various coordinates and sequencing of the processing station 26 are transformed into a language understood by the robotic controller 42 of the robotic arm 30. As previously described, the preferred robotic arm 30 is manufactured by Seiko. Thus, the translation is to a proprietary Seiko language known as DARLsp. The machine readable language is then fed to the robotic controller 42 in the processing station 26. Where the automated transfer machine 30 other than a robotic arm is employed, the translation will be to a language understood by that machine.

Once the sequencing station 24 downloads the requisite program to the processing station 26, the processing station 26 can be run independently. However, in the preferred embodiment, the sequencing station 24 remains connected to the processing station 26 during operation to provide process feedback. Specifically, when an operation error for the processing station 26 occurs, information concerning the error is transferred from the robotic controller 42 to the sequencing station 24. This information, in turn, is made available to an operator overseeing operation of the processing station 26 via a display in the sequencing station 24.

Figure 12:
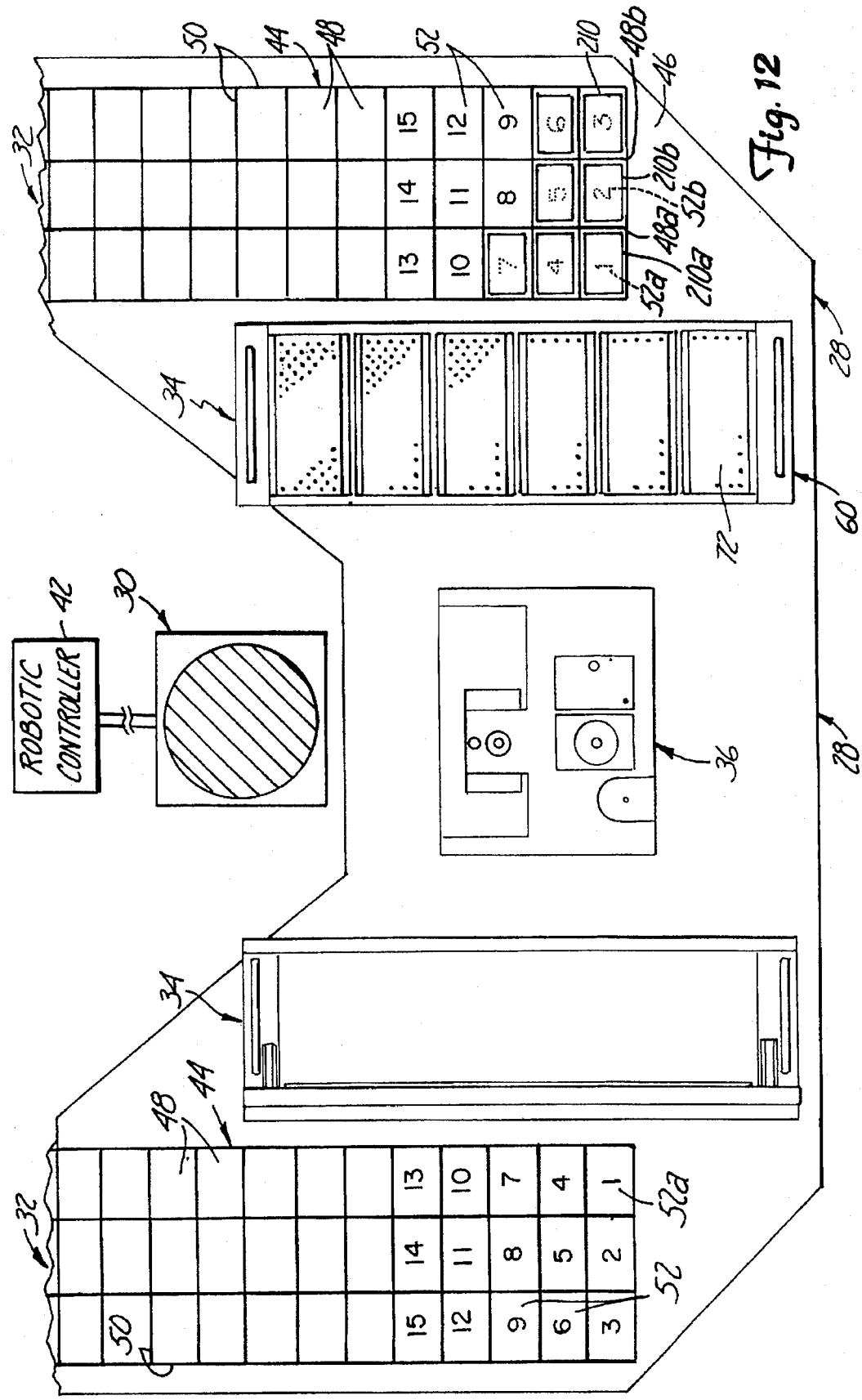
FIG. 12 is an enlarged partial top plan view of the processing station portion of the apparatus of FIG. 1 with a sectional view of the robotic arm, including a diagrammatic view of a robotic controller.

Once the processing station 26 has been programmed, the container storage area 32 is loaded with drill bit containers 210 as shown in FIG. 12. Drill bit containers 210 are placed in the container tray 44 according to a sequencing program developed by the data input station 22. As was previously described, the container tray 44 contains a number of openings 48 used to hold the various drill bit containers 210. By referring to the character designations 52 within each opening 48, the drill bit containers 210 are placed in the container tray 44 pursuant to the programmed sequence. In other words, as a normal job will call for multiple drill bit containers 210, these varying drill bit containers 210 must be placed in the container tray 44 according to a predetermined sequence which has been stored in the robotic controller 42. The predetermined sequence will dictate the order in which the drill bit containers 210 will be processed based upon the diameter of drill bits contained within each drill bit container 210.

For example, when job parameters require that drill bits of a first diameter must be the first to be process and loaded into a drilling package, the sequencing will indicate that a first drill bit container 210a with drill bits of a first diameter be placed in a first opening 48a having a character designation 52a of "1". The sequencing will then require that a second drill bit container 210b having drill bits of a second diameter be placed in a second opening 48b having a character designation 52b of "2" and so on. By this sequencing, the robotic controller 42 (shown generally in FIG. 12) is able to direct the retrieval of the properly sized drill bit container 210 from the container tray 44. The container storage area 32 shown in FIG. 12 has been loaded with seven drill bit containers 210.

The package holding area 34 is similarly loaded. As previously described, the type of package 72 and package frame 60 used in the package holding area 34 will depend upon the job specifications (i.e. type of drilling machine). As shown in FIG. 12, the package holding area 34 contains the package frame 60 and the cassettes 72 used for an Excellon Automation drilling machine. Once the package frame 60 has been loaded with cassettes 72, the frame 60 is attached to the work table 28 in the package holding area 34.

Figure 13:
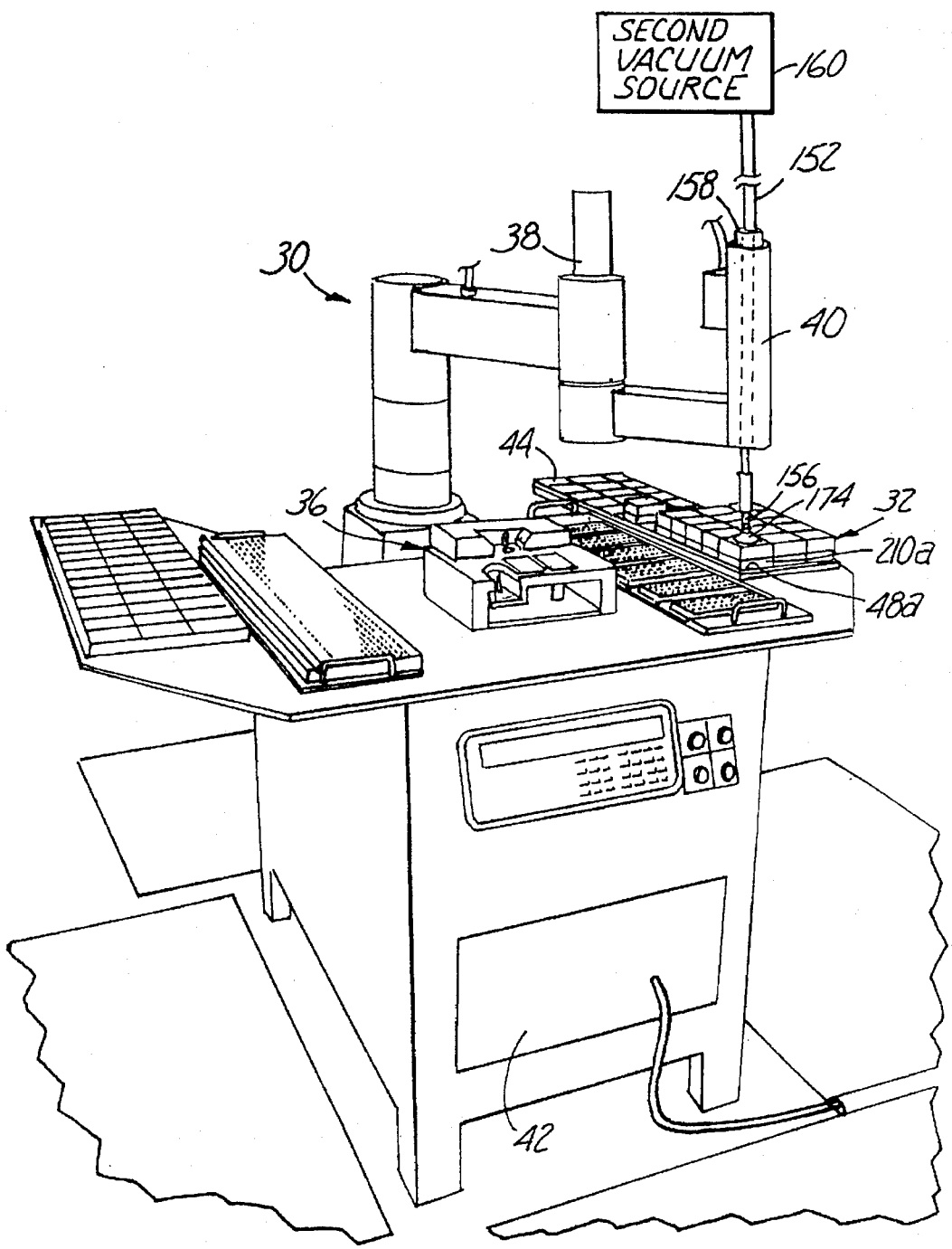
FIG. 13 is an enlarged perspective view of the proceeding station portion of the apparatus of FIG. 1 showing the robotic arm retrieving a drill bit container, including a diagrammatic view of the second vacuum source.

When the container storage area 32 and the package holding area 34 have been properly loaded, the sequencing station 24 is activated. The robotic arm 30 is maneuvered to secure the foot 174 to the collet 156 of the working shaft assembly 40. As shown in FIG. 13, the robotic arm 30 is then maneuvered to attach the first container 210a to the foot 174. To accomplish this, the maneuverable base 38, via directions from the robotic controller 42, positions the working shaft assembly 40 directly above the first drill container 210a which has previously been stored in the container tray 44. The coordinates of the first opening 48a in the container tray 44 and thus of the first drill container 210a have previously been stored in the robotic controller 42. The working shaft assembly 40 is moved downward until the foot 174 contacts the first drill bit container 210a. The extension of the foot 174 from the working shaft assembly 40 and the height of the first drill bit container 210a have been factored into the operations program and thus the exact vertical distance to be traveled by the working shaft assembly 40 has been stored into the robotic controller 42. The second vacuum source 160 (shown diagrammatically) is then activated by the robotic controller 42 to secure the first drill bit container 210a to the foot 174. The first drill bit container 210a will remain secured to the foot 174 so long as the second vacuum source 160 is activated.

Figure 14:
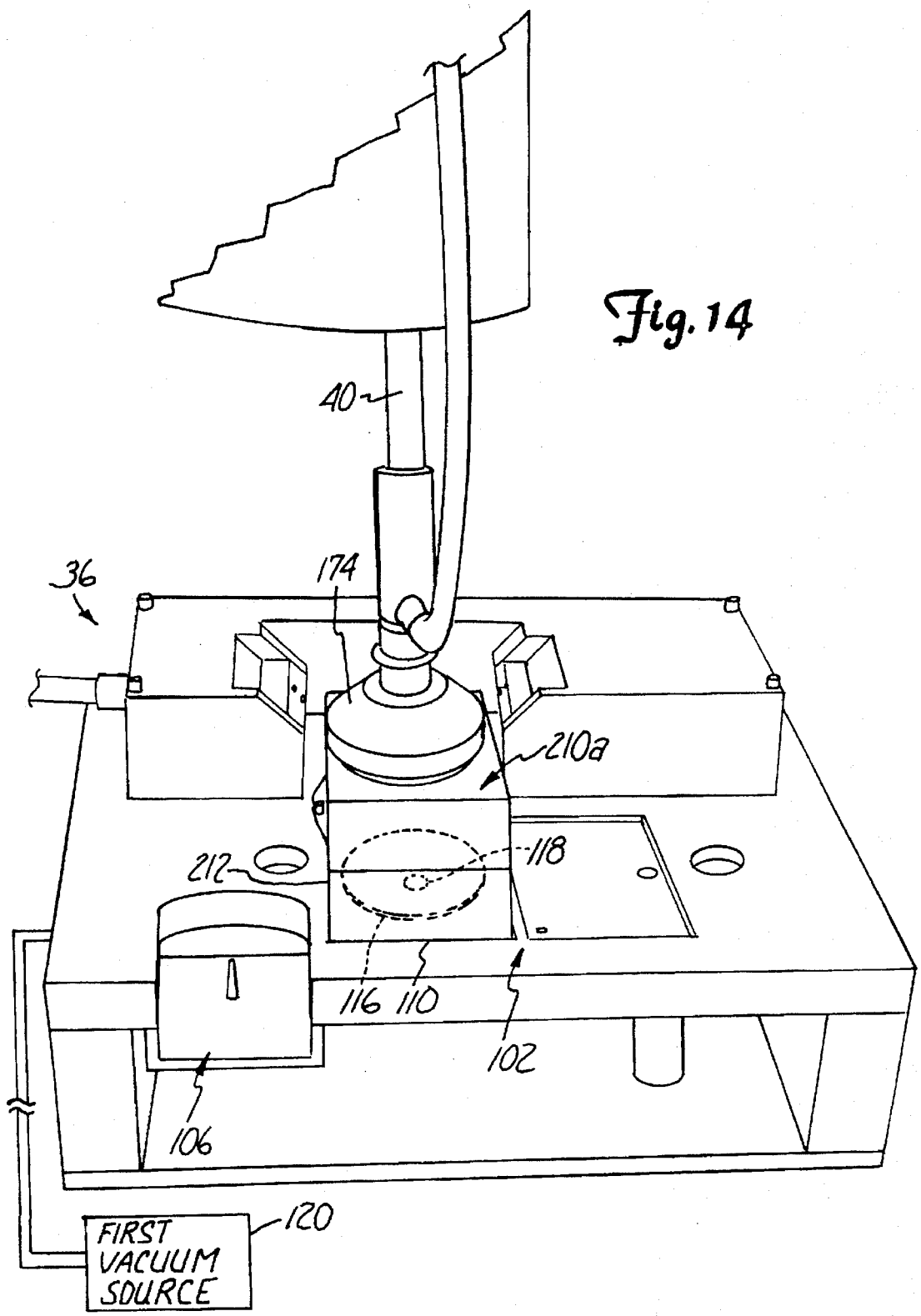
FIGS. 14 is an enlarged perspective view of the drill bit unloading and verification area of the apparatus of FIG. 1 showing the placement of a drill bit container, including a diagrammatic view of the first vacuum source.

The robotic arm 30 then delivers the first drill bit container 210a to the drill bit unloading and verification area 36. To accomplish this, the working shaft assembly 40 and the attached first drill bit container 210a are moved away from the container storage area 32 in a vertical fashion. The maneuverable base 38 then moves the working shaft assembly 40 such that the first drill bit container 210a is directly over the drill bit unloading and verification area 36. More specifically, as shown in FIG. 14, the first drill bit container 210a is positioned for placement in the bottom receiver 110 of the drill container holding shoe 102. The working shaft assembly 40 is lowered to place the first drill bit container 210a in the bottom support 110. The second vacuum source (160 in FIG. 13) is deactivated, thus breaking the seal or attachment between the foot 174 and the first drill bit container 210a. The base 212 of the first drill bit container 210a is secured to the bottom support 110 via the suction cup 116 and activation of the first vacuum source 120 (shown in block form) which is connected to the air tube 118. Notably, the coordinates of the bottom receiver 110 along with the necessary vertical distance to be travelled by the working arm 40 have previously been stored in the robotic controller (42 in FIG. 13).

Figure 15:
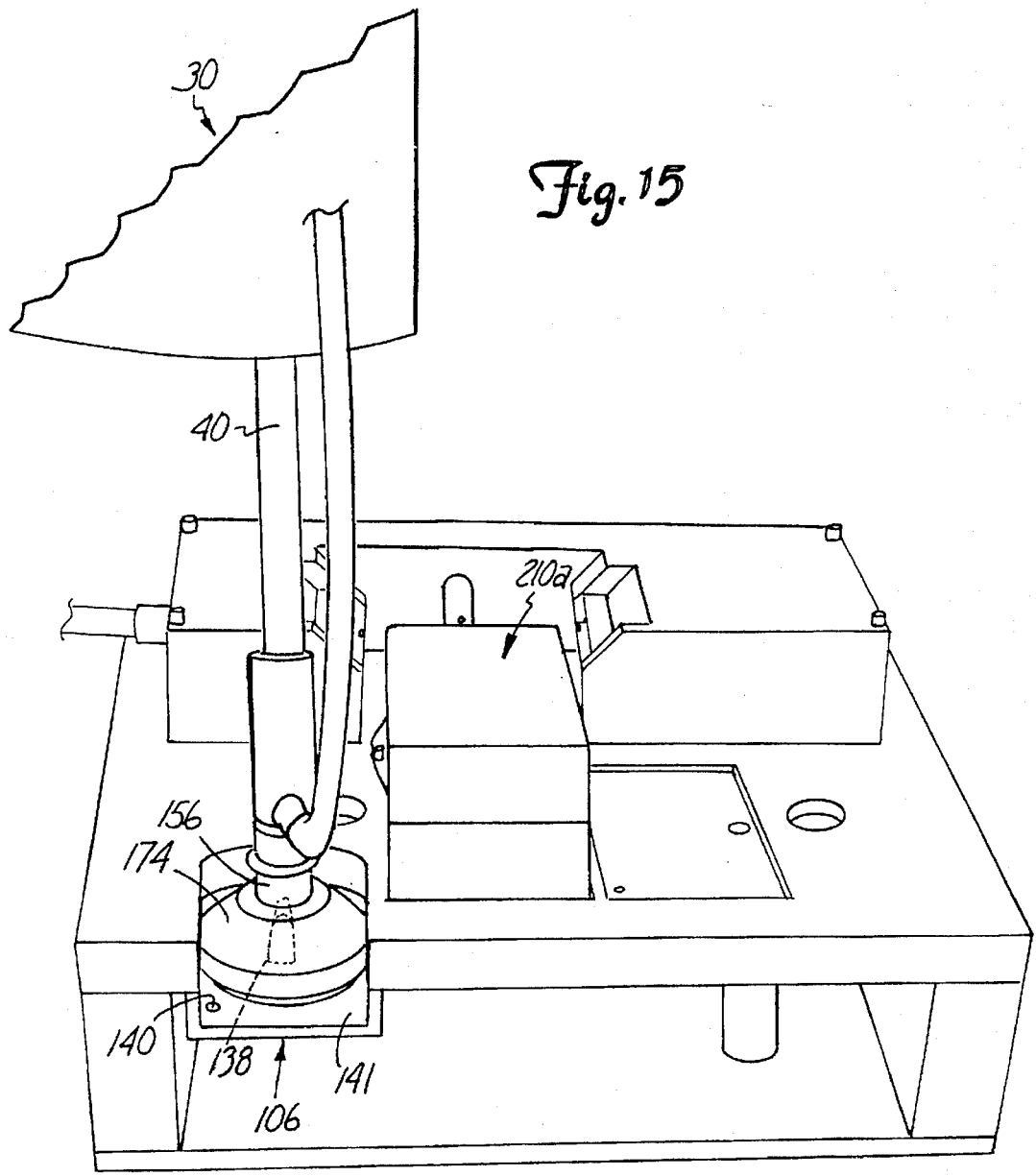
FIGS. 15–18 are enlarged perspective views of the drill bit unloading and verification area of the apparatus of FIG. 1 showing the opening of a drill bit container.

With the first drill bit container 210a secured within the drill bit unloading and verification area 36, the foot 174 is disengaged from the collet. The working arm 40 is positioned via the robotic controller (42 in FIG. 13) over the foot holding area 106, the coordinates of which have previously been stored into the robotic controller (42 in FIG. 13). As shown in FIG. 15, the working shaft assembly 40 lowers the foot 174 along the guide pin 138 until the foot 174 is just above the floor 141. The second vacuum source (160 in FIG. 13) is activated which in turn forces the foot 174 to be dislodged from the collet 156 and attach itself to the floor 141. Once the foot 174 has been disengaged from the collet 156, the working shaft assembly 40 is positioned to open the first drill bit conger 210a. Notably, the fiber optic sensor 140 in the foot holding area 106 provides verification of proper placement of the foot 174. If the fiber optic sensor 140 indicates that the foot 174 is not in the foot storage area 106 as the working shaft assembly 40 is retracted, the robotic controller (42 in FIG. 13) causes the robotic arm 30 to stop and provides a warning signal to prevent machine damage.

Figure 16:
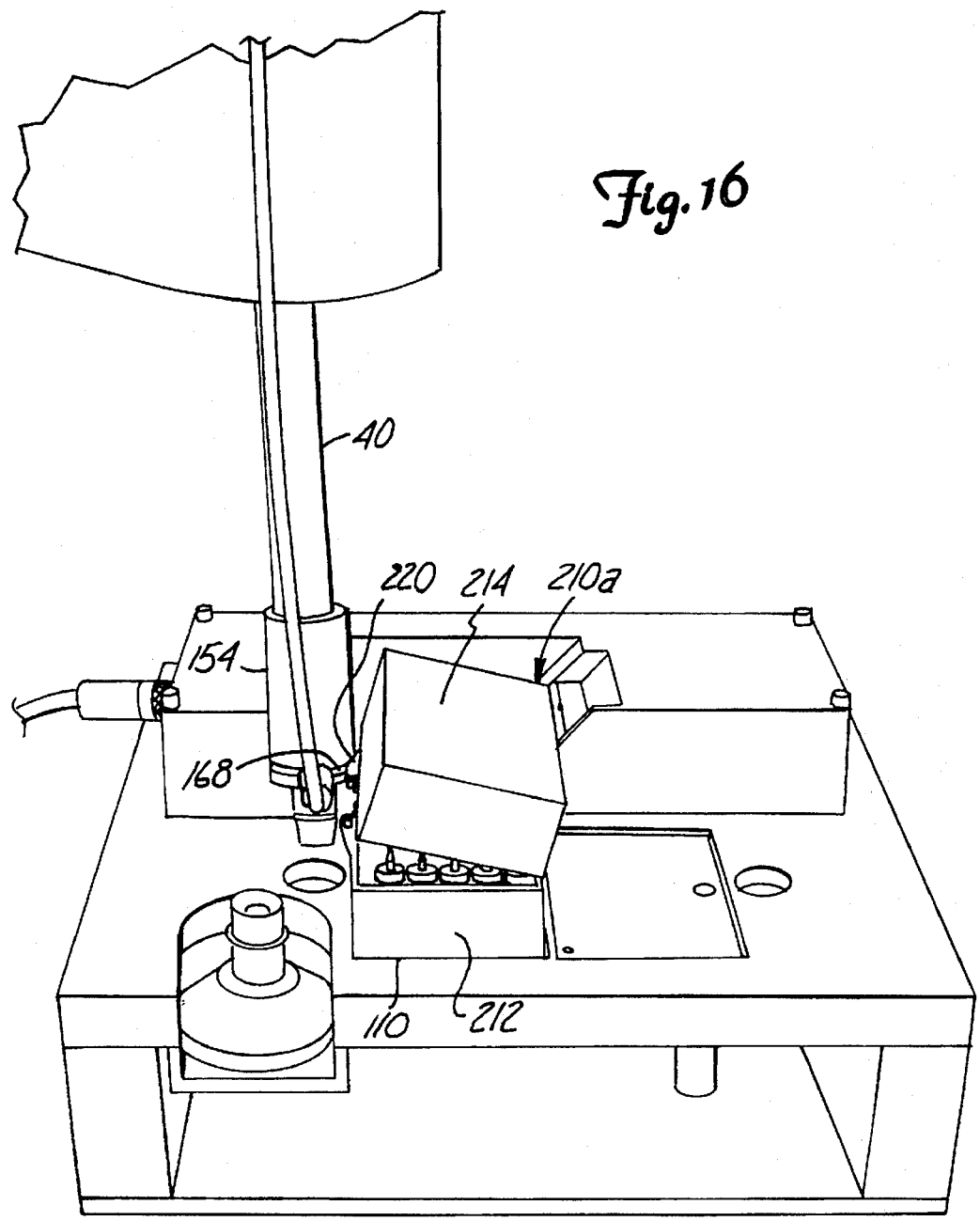
Figure 17:
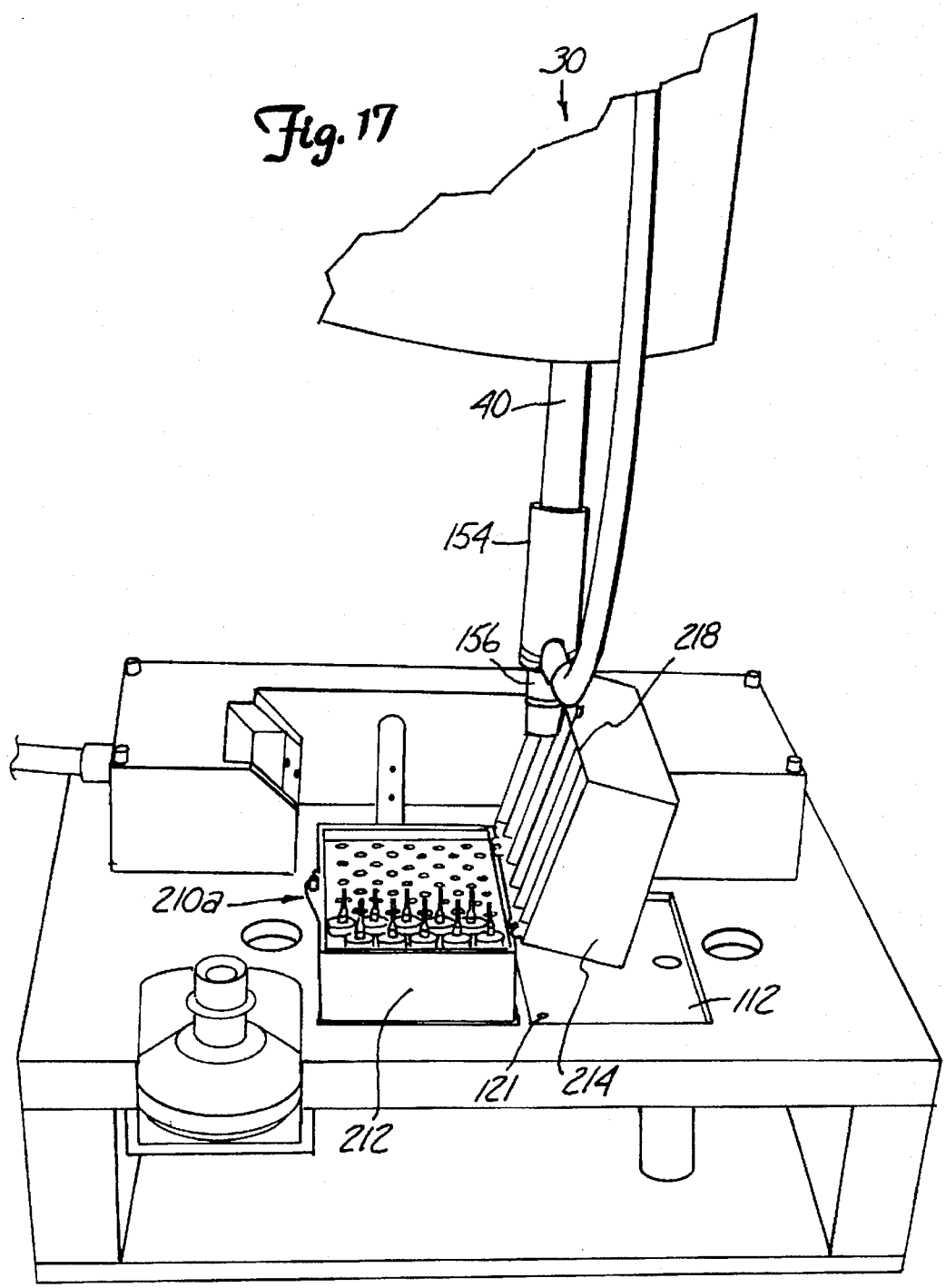

As shown in FIG. 16, the head 154 is used to initially separate the cover 214 of the first drill bit container 210a from the base 212. The working arm 40 is maneuvered such that the head 154 is adjacent to the first drill container 210a. The head 154 is moved closer to the first drill bit container 210a until the first tab 220 of the cover 214 nests within the annular notch 168 in the head 154. Based upon size of the first tab 220, extension of the first tab 220 from the cover 214, position of the first drill bit container 210a in the bottom receiver, and dimensions and location of the annular notch 168, all of which have previously been stored into the robotic controller (42 in FIG. 13), the head 154 is accurately positioned. The working shaft assembly 40 is moved upward, applying a vertical force to the first tab 220 and thus the cover 214. The base 212 remains stationary in the bottom support 110. As the head 154 moves upward, the cover 214 pivots on the pair of hinges (not shown) and begin to open. The vertical shaft 40 continues the upward motion until the first tab 220 is no longer in contact with the annular notch 168 of the head 154. At this position, the approximate vertical coordinates of which have previously been stored into the robotic controller (42 in FIG. 13), the cover 214 begin to pivot on the pair of hinges 216 and fall back towards the base 212. As shown in FIG. 17, the working shaft assembly 40 is maneuvered such that the collet 156 contacts the leading edge 218 of the cover 214. The working shaft assembly 40 is then directed to pivot the cover 214

(clockwise in FIG. 17) to the opened position in which the cover 214 rests on the cover receiver 112.

Figure 18:
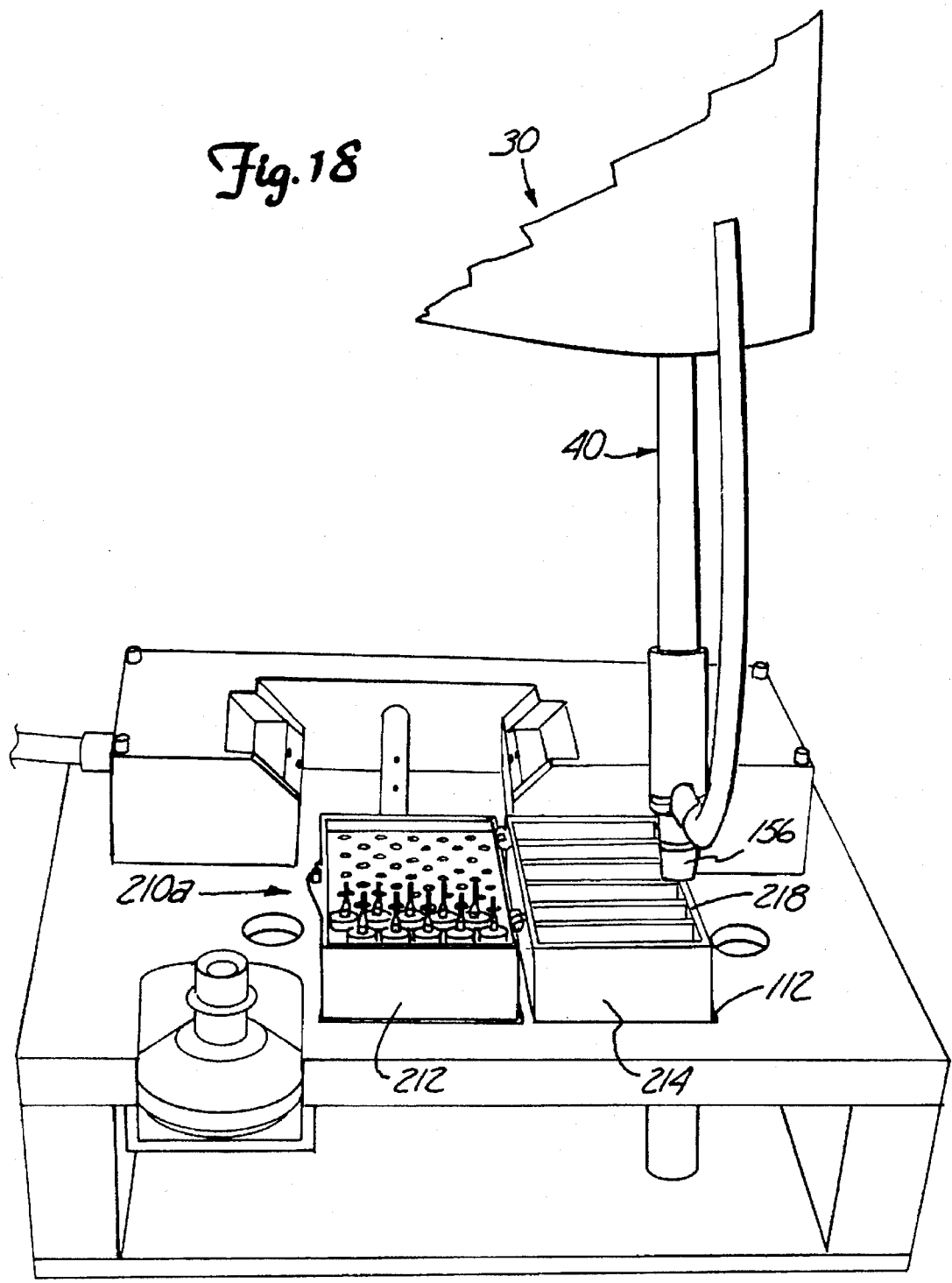

To secure the first drill bit container 210a in the opened position, the working shaft assembly 40 is maneuvered so that the collet 156 presses lightly on the leading edge 218 of the cover 214, forcing the cover 214 into frictional engagement with the cover receiver 112 as shown in FIG. 18. The optical sensor (121 in FIG. 17) verifies that the working shaft assembly 40 has secured the cover 214 within the cover receiver 112. If the optical sensor (121 in FIG. 17) indicates that the cover 214 has not been properly secured to the cover receiver 112, the robotic controller (42 in FIG. 13) causes the robotic arm 30 to stop and provides a warning signal to prevent machine damage.

Figure 19:
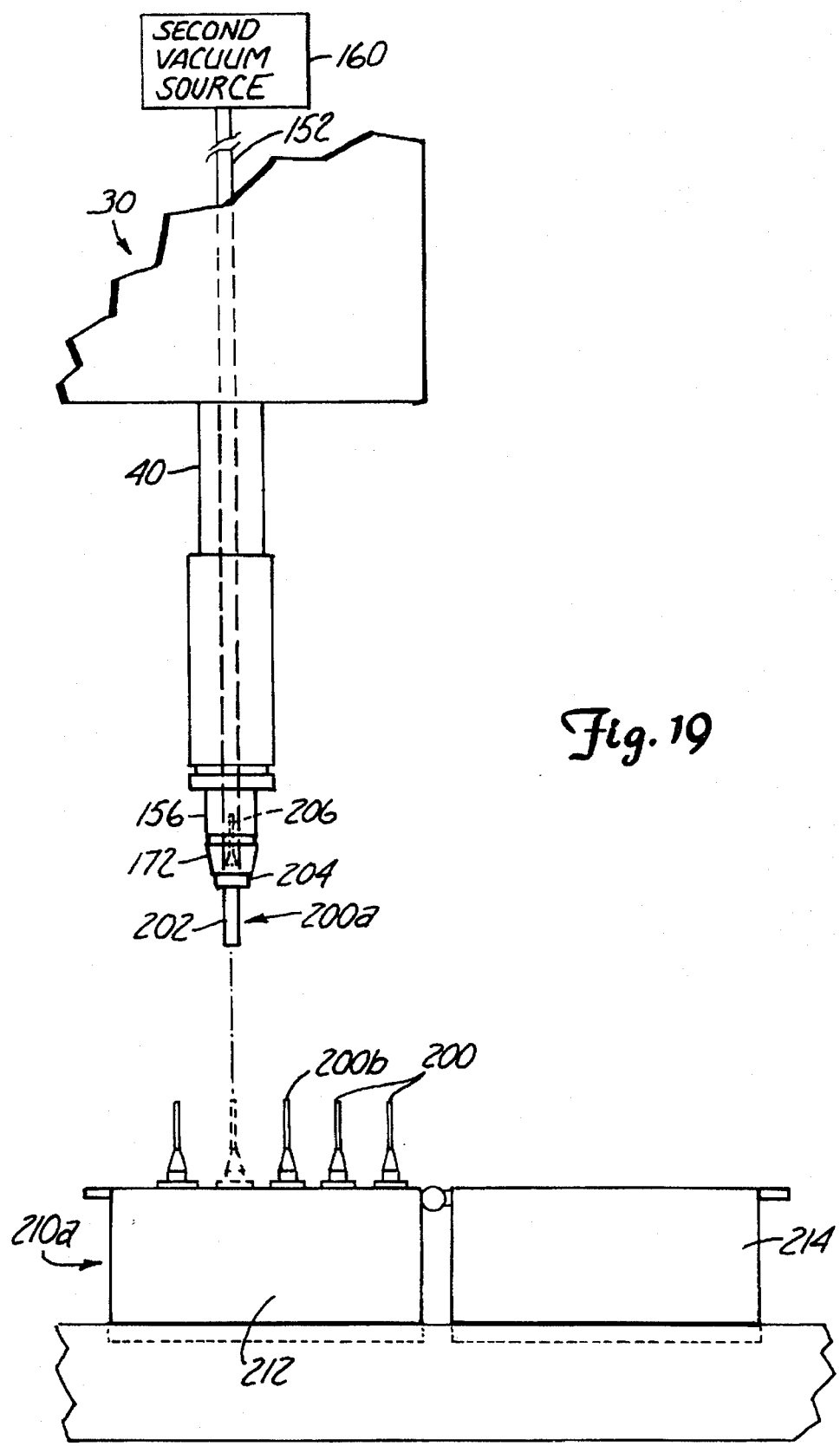
FIG. 19 is an enlarged side, partially sectioned view of the working shaft and the drill bit unloading and verification area portion of the apparatus of FIG. 1, including a diagrammatic view of the second vacuum source.

With the cover 214 secured within the cover receiver 112, the robotic arm 30 is used to remove a first drill bit 200a from the first drill container 210a as depicted in FIG. 19. The working shaft assembly 40 is maneuvered to a position directly above the first drill bit 200a in the base 212 of the first drill bit container 210a. As previously described, the preferred drill bit container 210a contains fifty drill bits 200 arranged in a symmetrical fashion. The first drill bit 200a is located in a front corner of this arrangement. Notably, location of the first drill bit 200a is previously stored in the robotic controller (42 in FIG. 13). The working shaft assembly 40 moves downward to allow the flute 206 of the first drill bit 200a to enter the collet 156. The tip 172 of the collet 156 is beveled so that any slight fluctuation in the exact location of the first drill bit 200a in the base 212 will not impede the flute 206 from entering the collet 156. The shaft 40 continues downward until the tip 172 is just above the setting ring 204. The second vacuum source 160 (shown in block form) is activated, suctioning the drill bit 200a upwards, via the air tube 152, into the collet 156 until the setting ring 204 contacts the tip 172. The first drill bit 200a is thus secured to the collet 156 and will remain so as long as the second vacuum source 160 is activated.

As an added safety feature, the first vacuum source 160 has a pressure sensor (not shown) which determines whether a drill bit 200 has been received into the collet 156 upon activation of the vacuum. If the pressure sensor indicates that the first drill bit 200a was not inserted into the collet 156 (and thus that no drill bit was found in the opening (not shown) in which drill bit 200 was expected to be), the working shaft is maneuvered to retrieve a subsequent drill bit 200b. This is a helpful feature as oftentimes a drill bit container will not be completely loaded with drill bits. With the drill bit 200a properly attached to the collet 156, the working shaft assembly 40 moves upward until the shank 202 of the first drill bit 200a clears the base 212 of the first drill bit container 210a.

Figure 20:
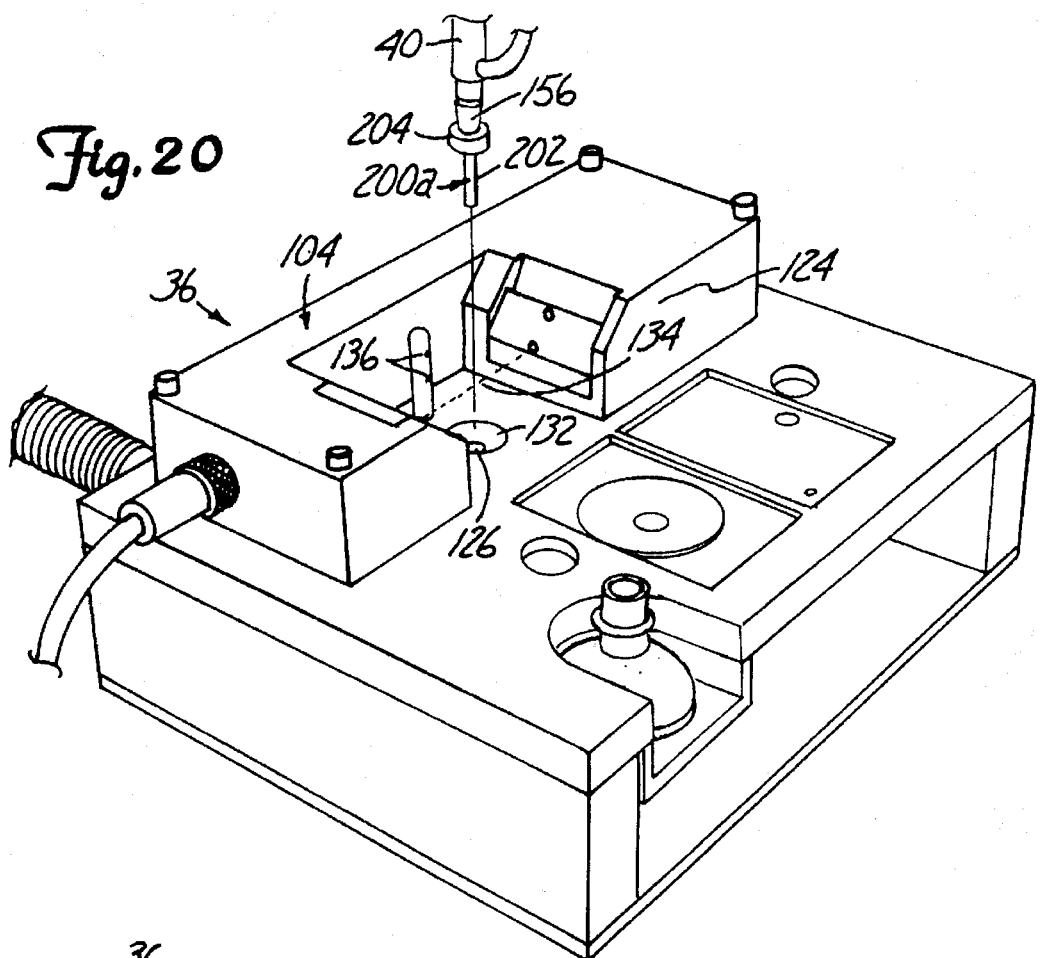
FIG. 20 is an enlarged perspective view of the drill bit unloading and verification area portion of the apparatus of FIG. 1 showing placement of a precision drill bit.
Figure 21:
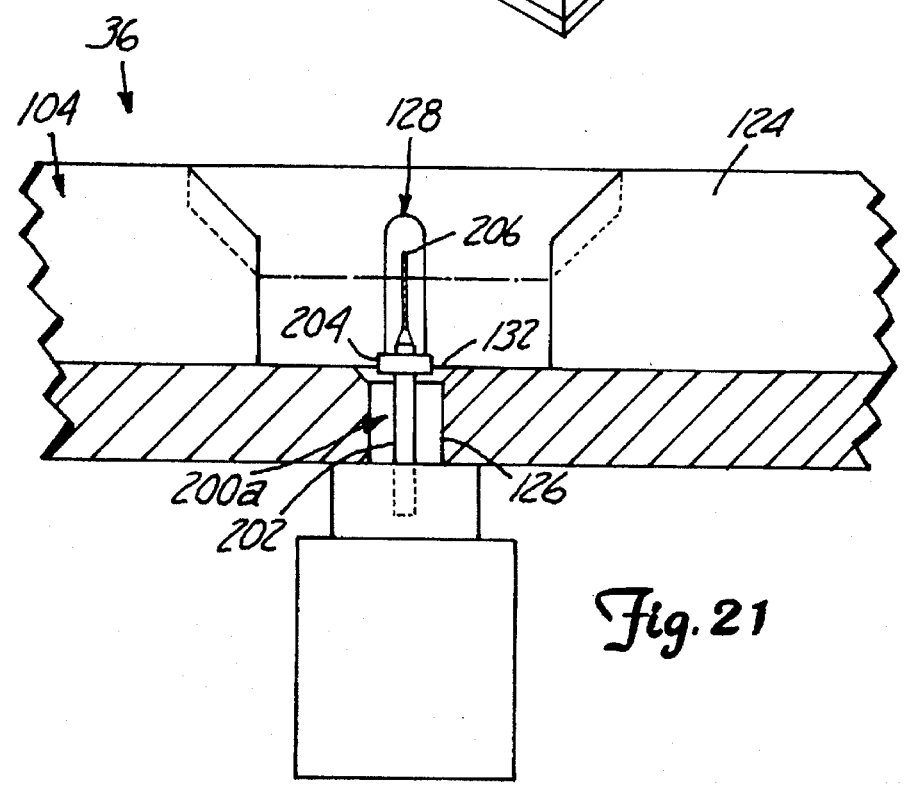
FIG. 21 is a side sectional view of the diameter sensing device of the apparatus of FIG. 1 including a precision drill bit.

As shown in FIGS. 20–21, the working shaft assembly 40 delivers the first drill bit 200a to the diameter sensing device 104 of the drill bit unloading and verification area 36. Notably, for clarification purposes, FIG. 20 is shown without the first drill bit container 210a in the drill bit unloading and verification area 36. The first drill bit 200a is nested in the rotatable bearing 126. This is accomplished by positioning the working shaft assembly 40 directly above the beveled receiving hole 132 within which the rotatable bearing 126 is located. The working shaft assembly 40 is then lowered to guide the shank 202 of the first drill bit 200a through the beveled receiving hole 132 and into the rotatable bearing 126. The beveled receiving hole 132 assists in guiding the shank 202 into the rotatable bearing 126 should there be any slight error in positioning of the working shaft assembly 40. Once so positioned, the second vacuum source (160 in FIG. 19) is deactivated to release the first drill bit 200a from the collet 156, and the working shaft assembly 40 is retracted. The rotatable bearing 126 is precision sized to receive the shank 202. When properly placed, the setting ring 204 of the first drill bit 200a rests on top of the rotatable bearing 126.

To ensure an accurate diameter reading, the flute 206 is cleaned of any debris by the cleaning device 128. A burst of air is forced from the air ports 136 across the flute 206. The laser scanner 124 projects the laser beam 134 across the flute 206 as the first drill bit 200a rotates with the rotatable bearing 126. The diameter sensing device 104 converts the laser measurement into a diameter reading which is compared against a range of acceptable diameters previously embedded in the robotic controller (42 in FIG. 13). The range of acceptable diameters is simply the specific diameter called for by the job plus or minus predetermined tolerances.

If the read diameter falls within the range of acceptable diameters, the first drill bit 200a is removed from the diameter sensing device 104 by the working shaft assembly 40 for delivery to the package holding area (34 in FIG. 22) via proper positioning of the working shaft assembly 40 and activation of the second vacuum source (160 in FIG. 19). If the measured diameter is not within the acceptable range, a second blast of air is imparted across the flute 206 by the cleaning device 128 and the diameter is measured a second time by the laser scanner 124. If the second read diameter is within the range of acceptable diameters, the first drill bit 200a is removed by the working shaft assembly 40 for delivery to the package holding area (34 in FIG. 22) via proper positioning of the working shaft assembly 40 and activation of the first vacuum source (146 in FIG. 19). If the second read diameter is not within the range of acceptable diameters, the first drill bit 200a is unusable for the job and is returned via the working shaft assembly 40 to the container holding shoe (102 in FIG. 19) and replaced in the first drill bit container (210a in FIG. 19). It is not necessary to recheck the diameter if it fails after the first reading, but it is preferable to do so to a avoid misreading due to excess debris.

As an added process check, the preferred method of operation will stop operation if three consecutive drill bits 200 are found to be out of the range of acceptable diameters. In other words, it is understood that a particular drill bit container 210 may have one or more drill bits 200 that are out of tolerance. However, three consecutive drill bits found to be out of tolerance indicates that the drill bit container 210 has been mismarked as to the diameter of drill bits 200 being held, or that a wrong drill bit container 210 was erroneously placed in the container storage area (32 in FIG. 13).

Figure 22:
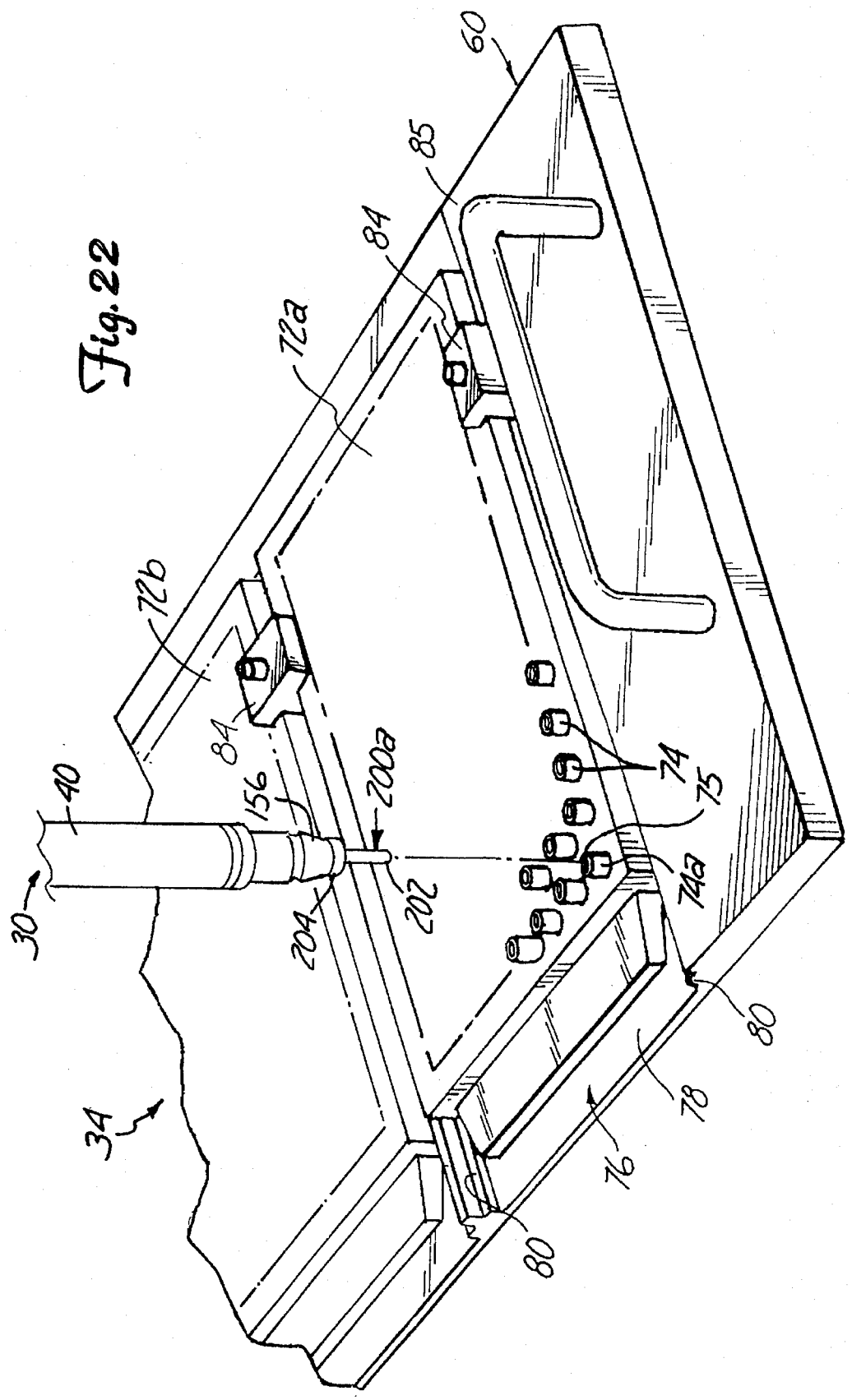
FIG. 22 is an enlarged, partial perspective view of the package frame portion of the apparatus of FIG. 1 showing placement of a precision drill bit by the working shaft.

As shown in FIG. 22, assuming the first drill bit 200a has an acceptable diameter, the working shaft assembly 40 delivers the first drill bit 200a to the package holding area 34. As previously described, the package frame 60 in the package holding area 34 maintains at least a first cassette 72a which is an Excellon Automation cassette. The location of the first cassette 72a and thus of the plurality of receiving members 74 contained within the first cassette 72a has previously been stored in the robotic control (42 in FIG. 13). The receiving members 74 are sequenced in the first cassette 72a such that a first receiving member 74a will receive the first drill bit 200a. Subsequent drill bits 200 may be similarly loaded in the remaining receiving members 74 in a sequential fashion. The working shaft assembly 40 centers the first drill bit 200a directly above the first receiving member 74a. The working shaft assembly 40 moves downward until the shank 202 of the first drill bit 200a passes through the first receiving member 74a. When the setting ring 204 approximately contacts the rim 75 of the second receiving member 74a, the first vacuum source (160 in FIG. 19) is deactivated, thus releasing the first drill bit 200a into the first receiving member 74a. The setting ring 204 rests on top of the rim 75 of the first receiving member 74a. Following release of the first drill bit 200a, the working shaft assembly 40 retracts in a vertical fashion thus ending the loading cycle for the first drill bit 200a. Notably, while the method of loading has been described using an Excellon Automation cassette 72, loading of other manufacturer's cassettes is substantially identical.

Should the first drill bit 200a fail to release from the collet 156, the head 154 has an added safety feature as previously described. The three axis sensor 162 (shown partially in FIG. 19) will act to deactivate the robotic arm 30 whenever the first drill bit 200 is located in the collet 156 unexpectedly. As the robotic controller 42 directs the collet 156 and the now unaccounted for first drill bit 200a to pass over an area along a plane for which the length of the first drill bit 200a has not been accounted, the first drill bit 200a will forcibly encounter an object, causing the collet 156 to pivot within the head 154. The three axis sensor 162 senses this movement, and causes the robotic controller (42 in FIG. 13) to stop the robotic arm (30 in FIG. 13) from moving.

Once the first drill bit 200a has its diameter verified and is loaded into the first cassette 72a, the robotic controller (42 in FIG. 13) performs several process evaluations based upon the previously entered program. First, the robotic controller (42 in FIG. 13) determines whether a second drill bit 200b (having the same diameter as the first drill bit 200a) is required for the first package 72a. If so, the working shaft assembly 40 returns to the drill bit unloading and verification area 36 and retrieves the second drill bit 200b (FIG. 19) from the first drill bit container 210a for placement in the first cassette 72a. Once the first cassette 72a has been loaded with the predetermined number of drill bits 200 having the same diameter as the first drill bit 200a, the robotic controller (42 in FIG. 13) determines whether a drill bit 200 having the same diameter as the first drill bit 200a is required for a second cassette 72b. If so, the working shaft assembly 40 returns to the drill bit unloading and verification area (36 in FIG. 19) and retrieves and verifies the necessary drill bits 200 for the second cassette 72b. This same process is repeated for any remaining cassettes 72.

Figure 23:
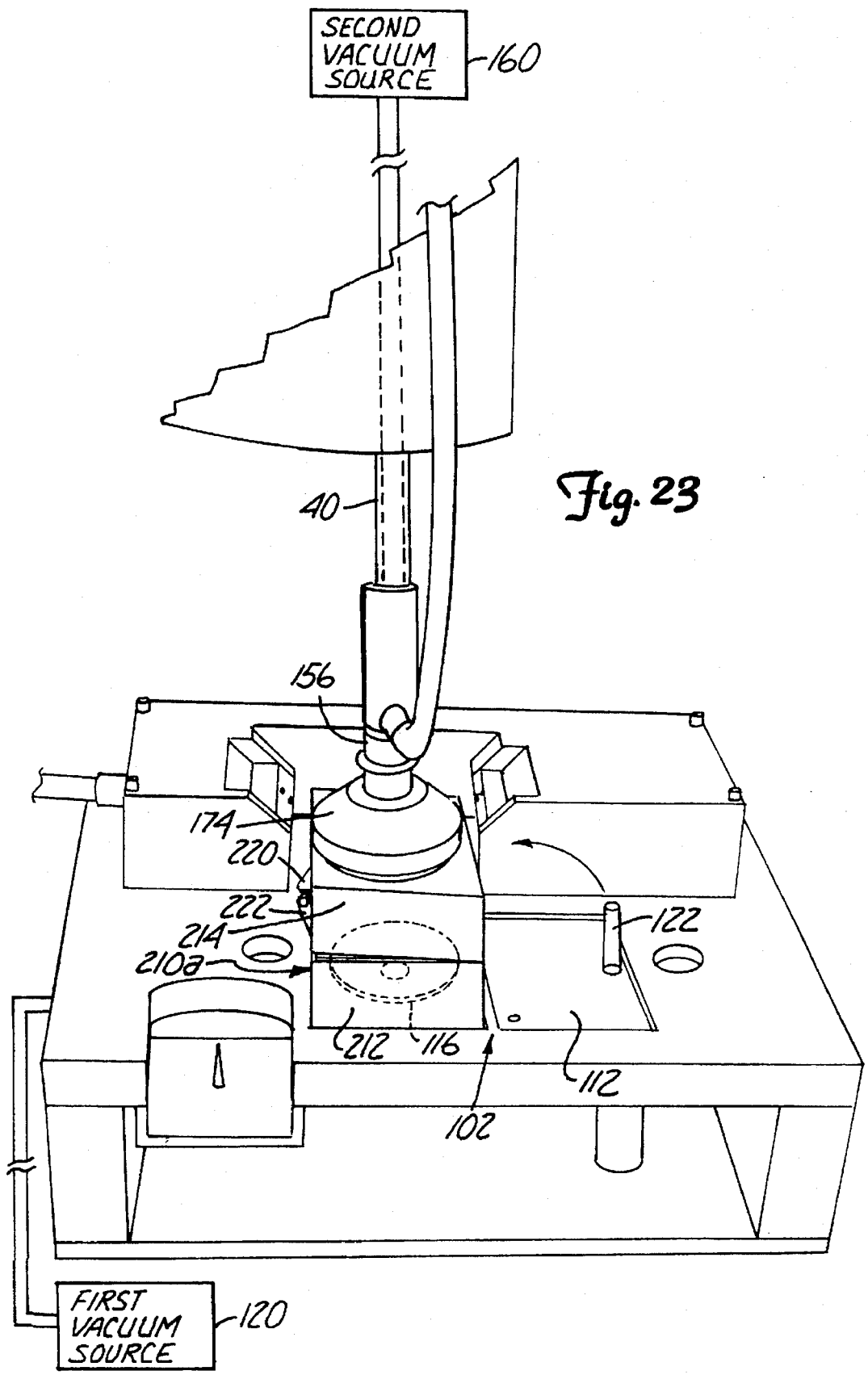
FIG. 23 is an enlarged, perspective view of the drill bit unloading and verification area portion of a robotic arm of the apparatus of FIG. 1 showing retrieval of a drill bit container by the robotic arm, including diagrammatic views of the first vacuum source and the second vacuum source.

Upon completion of the loading process for drill bits having a diameter found in the first drill bit container 210a, or when the supply of drill bits in the first drill bit container 210a is depleted, the robotic controller (42 in FIG. 13) causes the robotic arm 30 to return the first drill bit container 210a to its original position in the container storage area 32. As shown in FIG. 23, the foot 174 is reattached to the collet 156 via proper positioning and movement of the working shaft assembly 40. Further, the cover 214 of the first drill bit container 210a is returned to the closed position with respect to the base 212 by the ejector pin 122. The ejector pin 122 moves upward through the cover receiver 112 of the container holding shoe 102. This action forces the cover 214 to pivot (counterclockwise in FIG. 23) about the pair of hinges (not shown) to a closed position in which it rests on top of the base 212. The working shaft assembly 40 is maneuvered to a position directly above the cover 214 and moves downward until the foot 174 contacts the cover 214. This movement causes the first tab 220 of the cover 214 to engage the second tab 222 of the base 212, thus locking the cover 214 to the base 212. The second vacuum source 120 (shown in block form) is deactivated to release the seal between the suction cup 116 and the base 212. The second vacuum source 160 (shown in block form) is activated to attach the first drill bit container 210a to the foot 174. The working shaft assembly 40 is moved upwards to remove the first drill bit container 210a from the container holding shoe 102.

Figure 24:
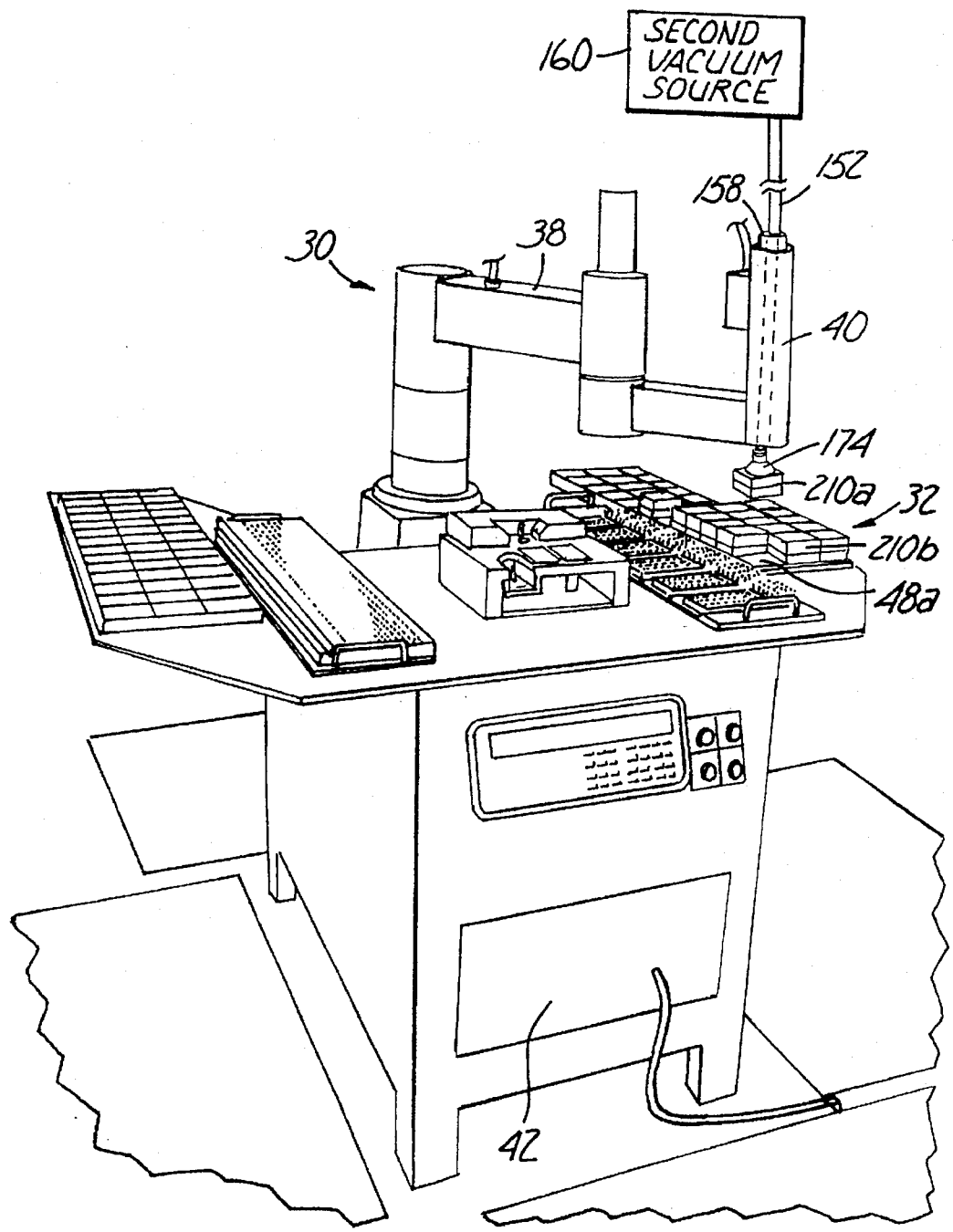
FIG. 24 is an enlarged perspective view of the processing station portion of the apparatus of FIG. 1, including a diagrammatic view of the second vacuum source.

The working shaft assembly 40 is maneuvered to return the first drill bit container 210a to the container storage area 32 as shown in FIG. 24. The working shaft assembly 40 positions the first drill container 210a directly over the first opening 48a in the container tray 44. The working shaft assembly 40 is lowered to place the first drill container 210a in the first opening 48a after which the second vacuum source 160 (shown diagrammatically) is deactivated to detach the first drill bit container 210a from the foot 174. The working shaft assembly 40 is then raised. Based upon previously embedded information, the robotic controller 42 determines whether a second drill bit container 210b is required for processing. If the second drill bit container 210b is not required, the job is complete. If, however, further processing (i.e. additional drill bits 200) is required, the working shaft assembly 40 is positioned directly above the second drill bit container 210b for attachment to the foot 174. The previously described unloading, verification and package loading functions are repeated for the second drill bit container 210b. Similar processing takes place for any remaining drill bit containers 210 sequentially loaded in the container holding area 32 until the job is complete.

Figure 25:
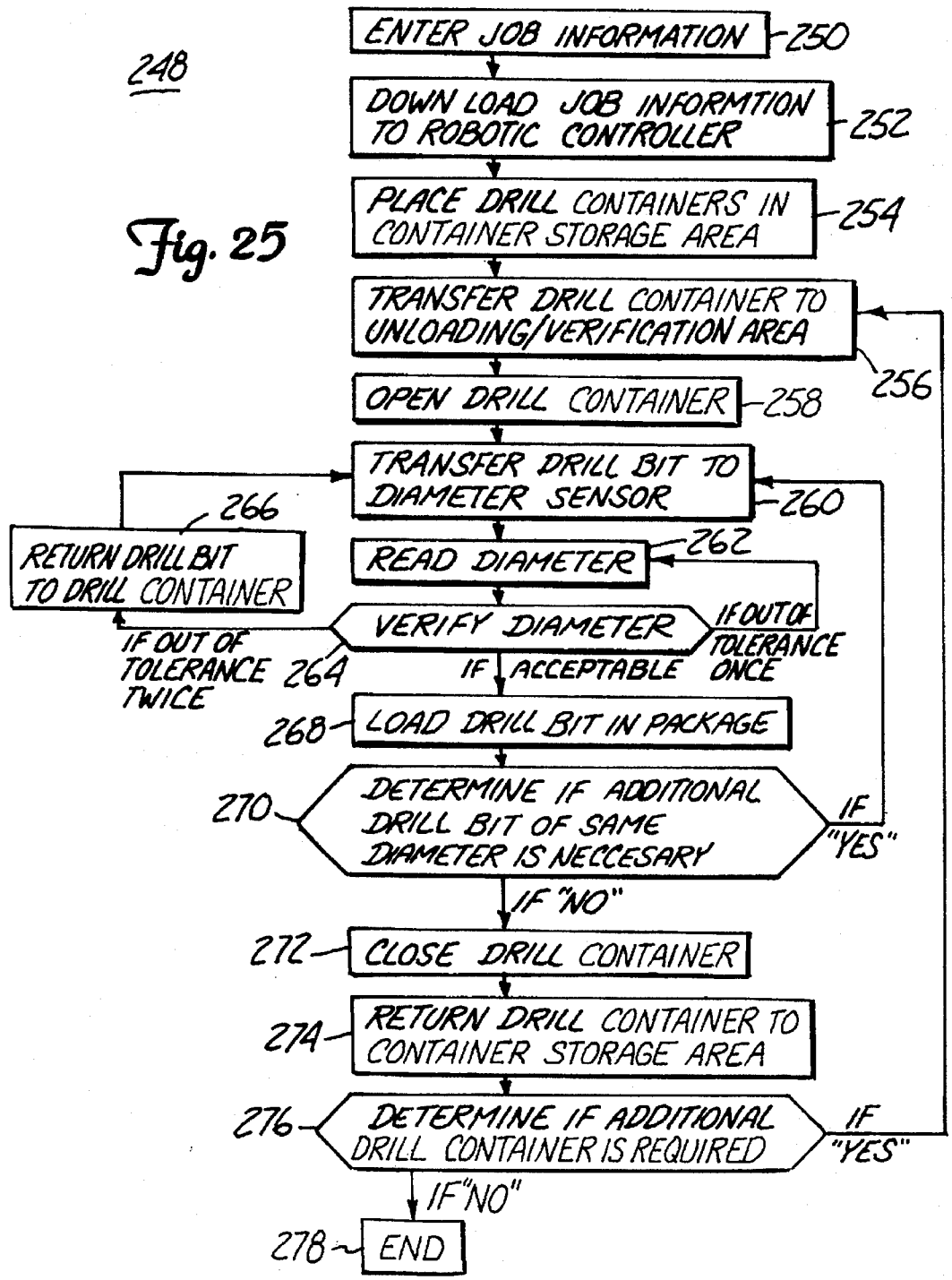
FIG. 25 is a block diagram of a method of automated verification and loading of a drilling package with a precision drill bit.

The method of operation 248 is summarily shown by a block diagram in FIG. 25. Job specific information is first entered at block 250. In block 252 this information is downloaded to the robotic controller 42. Drill bit containers 210 are sequentially placed into the container storage area 32 according to the previously entered job information at block 254. As represented by block 256, the robotic arm 30 successively transfers an individual drill bit container 210 to an unloading/verification area 36. The robotic arm 30 is used to open the transferred drill bit container 220 in block 258. Block 260 shows an individual drill bit 200 then being transferred to a diameter sensing device 104. At block 262, the diameter of the drill bit 200 is read. This read diameter is verified against predetermined diameter range embedded in the robotic controller 42 at block 264. If the verification at block 264 reveals that the diameter of the drill bit 200 is not within the acceptable range, the process returns to block 262 and where the diameter is remeasured. If the drill bit is twice found to be unacceptable, the drill bit 200 is returned to the drill bit container 210, as detailed at block 266. The process returns to block 260 whereby the robotic arm 30 transfers a successive drill bit 200 to the diameter sensing device 104.

Returning to block 264, when the sensed diameter of the drill bit 200 is within the acceptable range, the robotic arm 30 sequentially loads the drill bit 200 in the package 72 at block 268. As shown at block 270, the robotic controller then determines whether the job requires an additional drill bit 200 having the same diameter as the previous drill bit 200. If an additional same diameter drill bit 200 is required, the process returns to block 260 for drill bit unloading and diameter verification. Returning to block 270, if no additional drill bits 200 having a diameter similar to that previously loaded are required, the drill bit container 210 is closed as shown at block 272. As referenced at block 274, the now closed drill bit container 210 is returned to the container storage area 32. At block 276, the robotic controller 42 determines whether an additional, sequentially loaded, drill bit container 210 is required for processing. If so, a successive drill bit container 210 is transferred from the container storage area 32 to the unloading/verification area 36, indicated at block 256, for subsequent processing. If no additional drill bit containers 210 are required, the process is ended, represented by block 278.

The method and apparatus for automated verification and loading of precision drill bits into a drilling machine package overcomes the many deficiencies of the manual method currently employed. Namely, the present invention can rapidly load precision drill bits into a wide variety of drilling manufacturer's packages with minimal set-up or error. The apparatus configures the job based upon basic job specifications. Further, as each and every precision drill bit loaded has its diameter measured and verified, the resulting drilling packages will consistently be loaded with accurate diameter precision drill bits, a result not previously realized. Finally, actual contact between an operator and individual drill bits is greatly limited, virtually eliminating operator injury.

Although the present invention has been described with reference to preferred embodiments, workers skilled in the art will recognize that changes may be made in form and detail without departing from the spirit and scope of the invention. For example, the work table need only have one package holding area and one container storage area. The preferred embodiment employs two of these areas so that while the apparatus is processing a first job, an operator can prepare the second package holding area and second container storage area with the necessary components for a second job to be processed upon completion of the first. Similarly, the data input station and the sequencing station can be combined into one device. Additionally, safety mats can be dispersed about the floor around the automated transfer machine to act as a safety measure. Any time an operator moves within the dangerous zone of operation, the safety mats will cause the apparatus to stop movement.

The apparatus has been described as storing specific coordinate locations in the robotic controller which are then used to direct the robotic arm. However, an optical sensor or vision recognition system could be used in conjunction with the robotic arm to properly position the working shaft during each stage of operation. With such a system, the storing of exact coordinates in the robotic controller is not required. Similarly, while the preferred embodiment has located the diameter sensing device apart from the robotic arm, the device could be placed directly on the arm. If done in this manner, the diameter of a precision drill bit could be measured as the robotic arm moves the precision drill bit from one area to another. Finally, the use of the container storage area is unnecessary where an operator hand delivers individual drill bit containers to the drill bit unloading and verification area.

What is claimed is:

1. A method of loading drilling packages with precision drill bits, the method including:

retrieving information which defines precision drill bits to be placed in selected positions in selective drilling packages;

placing drill bit containers in a container storage area according to the retrieved information;

transferring a drill bit container having drill bits of a uniform diameter from the container storage area to a container receiving area;

transferring a precision drill bit from the drill bit container to a diameter sensor;

measuring a diameter of the precision drill bit;

comparing the diameter of the precision drill bit with a tolerance range based upon the retrieved information;

loading the precision drill bit at a selected position in an unloaded drilling package when the diameter is within a tolerance range, the selected position being based upon the retrieved information; and returning the drill bit container to the container storage area.

2. An automated method of loading a drilling package with precision drill bits from a drill bit container using an automated transfer machine having a control device in which the job related data is stored, the method including:

placing a first drill bit container having precision drill bits of a first diameter on a container receiving member, wherein the first diameter is based upon the stored data;

using the automated transfer machine to transport a first precision drill bit from the first drill bit container;

measuring a diameter of the first precision drill bit;

transporting the first precision drill bit to a first drilling package; and placing the first precision drill bit in a first opening in the first drilling package, wherein prior to receiving the first precision drill bit, the first drilling package is empty and the first opening is one of a number of available openings.

3. The method of claim 2, wherein the first drilling package is maintained within a package frame and wherein transporting the first precision drill bit to the first drilling package includes:

using the automated transfer machine to move the first precision drill bit to the package frame.

4. The method of claim 2, wherein the automated transfer machine is used in placing the precision drill bit in the first opening in the first drilling package.

5. The method of claim 2, further including:

storing information which defines precision drill bits to be placed in selected positions in selective drilling packages.

6. The method of claim 2, wherein the control device includes an input means for entering information, the method further comprising:

inputting information which defines precision drill bits to be placed in selected positions in selective drilling packages.

7. The method of claim 2, wherein the automated transfer machine is a robotic arm which includes a shaft having a downwardly extending gripper to which a foot for securing a precision drill bit container to the robotic arm is removably attached, and further wherein placing the first drill bit container on the container receiving member includes:

attaching the foot to the gripper;

positioning the shaft over the first drill bit container;

securing the first drill bit container to the foot;

transporting the first drill bit container to the container receiving member; and releasing the first drill bit container.

8. The method of claim 2 further including:

comparing the measured diameter with a tolerance range based upon drill bit size and sequence data stored in the control device.

9. The method of claim 8, further including:

determining whether the measured diameter is within the tolerance range; and rejecting the drill bit if the measured diameter is not within the tolerance range.

10. The method of claim 2 wherein measuring the diameter of the first precision drill bit includes:

using a diameter sensing device to sense the diameter of the first precision drill bit, wherein the diameter sensing device is operably associated with the automated transfer machine.

11. The method of claim 10, wherein the diameter sensing device includes an optical source measuring means assembly having a rotatable bearing, and further wherein measuring the diameter of the first precision drill bit includes:

placing the first precision drill bit in the rotatable bearing;

rotating the first precision drill bit within the bearing;

cleaning debris from a blade portion of the first precision drill bit; and projecting a light beam from the optical source measuring means across the blade portion of the first precision drill bit.

12. The method of claim 2 wherein the control device controls movements of the automated transfer machine.

13. The method of claim 2 wherein using the automated transfer machine is a robotic arm.

14. The method of claim 2 wherein using the automated transfer machine to transport the first precision drill bit includes:

securing the first precision drill bit to the automated transfer machine, the automated transfer machine comprising a shaft with an attached gripper for removably securing the first precision drill bit.

15. The method of claim 14 wherein the shaft is hollow and the gripper comprises a collet, having an aperture, extending downwardly from the shaft and a tube having an open end connected to the shaft, and further wherein securing the first precision drill bit to the automated transfer machine includes:

positioning the collet over the first precision drill bit; and creating a pressure differential in the collet.

16. The method of claim 15, wherein the collet has a bevelled tip for guiding the first precision drill bit into the aperture.

17. The method of claim 2, wherein the first drill bit container has a base pivotally attached to a cover, and wherein the container receiving member includes a first support for receiving the base and a second support for receiving the cover, and further wherein placing the first drill bit container on the container receiving member includes:

securing the base to the first support; and securing the cover to the second support.

18. The method of claim 17 wherein the container receiving member further includes an ejector device for dislodging the cover from the second support, the method further including:

closing the cover of the first drill bit container by activating the ejector device.

19. The method of claim 2, further including:

retrieving the first drill bit container from a container tray, located within an area accessible by the automated transfer machine, for placing on the container receiving member.

20. The method of claim 2, wherein a plurality of drill bit containers are provided including the first drill bit container having precision drill bits of the first diameter and a second drill bit container having precision drill bits of a second diameter, the method further including:

arranging the first drill bit container and the second drill bit container at predetermined locations accessible by the automated transfer machine.

21. The method of claim 20 wherein the predetermined locations are based upon job-related data stored in the control device.

22. The method of claim 2, further including:

determining whether a second precision drill bit having a same diameter as the first precision drill bit is required for the first drilling package based upon the stored data.

23. The method of claim 22, further including:

determining whether a third precision drill bit having a same diameter as the first precision drill bit is required for a second drilling package.

24. An automated method of processing precision drill bits from a drill bit container using an automated transfer machine having a control device in which job-related data is stored, the method including:

placing a first drill bit container having precision drill bits of only a first diameter on a container receiving member, wherein the first diameter is based upon the stored data;

using the automated transfer machine to transport a first precision drill bit from the first drill bit container;

sensing a parameter related to a diameter of the first precision drill bit;

comparing the sensed parameter with a predetermined range, wherein the predetermined range is based upon the stored data; and signalling the automated transfer machine to process the first precision drill bit based upon the comparison.

25. The method of claim 24 and further including:

loading the first precision drill bit in a first drilling package in response to the signalling.

26. The method of claim 24 and further including:

returning the first precision drill bit to the first drill bit container in response to the signalling.

27. An automated method of loading a drilling package with precision drill bits from a drill bit container using an automated transfer machine having a control device in which job-related data is stored, wherein the drill bit container has a cover pivotally connected to a base so as to provide an opened position in which the precision drill bits contained therein are accessible and a closed position, the method including:

placing a first drill bit container having precision drill bit of a first diameter on a container receiving member, wherein the first diameter is based upon the stored data;

moving the cover of the first drill bit container from the closed position to the opened position;

using the automated transfer machine to transport a first precision drill bit from the first drill bit container;

measuring a diameter of the first precision drill bit;

transporting the first precision drill bit to a first drilling package; and placing the first precision drill bit in a first opening in the first drilling package.

28. The method of claim 27, wherein the cover has a tab to assist in pivoting the cover away from the base, and wherein the automated transfer machine is a robotic arm which includes a shaft having a downwardly extending head, and further wherein moving the cover from the closed position to the opened position includes:

securing the base of the first drill bit container to the container receiving member;

engaging the tab of the cover with the head; and maneuvering the cover through an upward motion of the shaft to the opened position.

29. The method of claim 27, further including:

using the automated transfer machine to remove the first drill bit container from the container receiving member; and placing a second drill bit container having precision drill bits of a second diameter on the container receiving member, wherein the second diameter is based upon the stored data.

30. An automated method of loading a drilling package with precision drill bits from a drill bit container using a robotic arm which includes a shaft to which a foot for securing a drill bit container to the robotic arm is removably attached and a control device in which job-related data is stored, the method including:

attaching the foot to the shaft;

placing a first drill bit container having precision drill bits of a first diameter on a container receiving member, wherein the first diameter is based upon the stored data;

using the robotic arm to transport a first precision drill bit from the first drill bit container;

measuring a diameter of the first precision drill bit;

transporting the first precision drill bit to a first drilling package; and placing the first precision drill bit in a first opening in the first drilling package.

31. The method of claim 30, wherein attaching the foot to the shaft includes:

positioning a lower end of the shaft over the foot; and moving the shaft to engage the foot.

* * * * *

UNITED STATES PATENT AND TRADEMARK OFFICE
CERTIFICATE OF CORRECTION

PATENT NO. : 5,655,354

DATED : AUGUST 12, 1997

INVENTOR(S) : JAMES C. BAKER, ROBERT C. HENNINGSGARD, BENJAMIN MIHAI, PAUL D. MORTELL, TIM L. TAYLOR

It is certified that error appears in the above-indentified patent and that said Letters Patent is hereby corrected as shown below:

Col. 1, line 39, delete "Becuase", insert --Because--

Col. 1, line 61, delete "spindle s", insert --spindles--

Col. 4, line 59, after "apparatus", insert --in--

Col. 4, line 62, after "apparatus", insert --of--

Col. 5, line 25, delete "proceeding", insert --processing--

Col. 5, line 29, delete "FIGS.", insert --FIG.--

Col. 5, line 30, after "area", insert --portion--

Col. 7, line 19, delete "94", insert --34--

Col. 7, line 62, delete "fictional", insert --frictional--

Col. 8, line 26, delete "mm", insert --turn--

Col. 9, line 9, delete "fictional", insert --frictional--

Col. 11, line 54, delete "dosed", insert --closed--

Col. 12, line 22, delete "being", insert --begins--

Col. 14, line 34, delete "conger", insert --container--

UNITED STATES PATENT AND TRADEMARK OFFICE
CERTIFICATE OF CORRECTION

PATENT NO. : 5,655,354

DATED : AUGUST 12, 1997

INVENTOR(S) : JAMES C. BAKER, ROBERT C. HENNINGSGARD, BENJAMIN MIHAI, PAUL D. MORTELL, TIM L. TAYLOR

It is certified that error appears in the above-identified patent and that said Letters Patent is hereby corrected as shown below:

Col. 14, line 34, delete "conger", insert --container--

Col. 14, line 57, delete "begin", insert --begins--

Col. 14, line 63, delete "begin", insert --begins--

Col. 15, line 23, delete "comer", insert --corner--

Col. 15, line 58, delete "beating", insert --bearing--

Signed and Sealed this

Twenty-seventh Day of January, 1998

Attest:

BRUCE LEHMAN

Attesting Officer

Commissioner of Patents and Trademarks